(12) United States Patent
Tsukamoto et al.

(10) Patent No.: US 9,091,566 B2
(45) Date of Patent: Jul. 28, 2015

(54) BINARIZATION CIRCUIT FOR BINARIZING DETECTION SIGNAL REPRESENTING ROTATION OR MOVEMENT OF OBJECT

(75) Inventors: Manabu Tsukamoto, Tokyo (JP); Kazuyasu Nishikawa, Tokyo (JP); Takashi Tokunaga, Tokyo (JP); Hideki Shimauchi, Tokyo (JP); Yoshinori Tatenuma, Tokyo (JP); Yuji Kawano, Tokyo (JP); Hiroshi Kobayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 402 days.

(21) Appl. No.: 13/520,285

(22) PCT Filed: Nov. 29, 2010

(86) PCT No.: PCT/JP2010/071249
§ 371 (c)(1),
(2), (4) Date: Jul. 2, 2012

(87) PCT Pub. No.: WO2011/104961
PCT Pub. Date: Sep. 1, 2011

(65) Prior Publication Data
US 2013/0002242 A1    Jan. 3, 2013

(30) Foreign Application Priority Data
Feb. 23, 2010  (JP) .................................. 2010-036966

(51) Int. Cl.
*G01B 7/00*   (2006.01)
*G01D 5/244*  (2006.01)
(Continued)

(52) U.S. Cl.
CPC ................ *G01D 5/2448* (2013.01); *H02P 1/00* (2013.01); *G01D 1/00* (2013.01); *G01R 1/00* (2013.01); *H02P 2201/00* (2013.01); *H02P 2203/00* (2013.01)

(58) Field of Classification Search
CPC ... H02P 1/00; H02P 2201/00; H02P 2203/00; G01R 1/00; G01D 1/00
USPC ........................................ 324/207.12–207.26
See application file for complete search history.

(56) References Cited

U.S. PATENT DOCUMENTS 5,493,219 A    2/1996   Makino et al.
5,497,084 A *  3/1996   Bicking .................... 324/207.25
(Continued)

FOREIGN PATENT DOCUMENTS

DE     198 44 663 C2   9/2000
JP         59 8112       1/1984
(Continued)

OTHER PUBLICATIONS

International Search Report Issued Feb. 22, 2011 in PCT/JP10/71249 Filed Nov. 29, 2010.
(Continued)

*Primary Examiner* — Jermele M Hollington
*Assistant Examiner* — Temilade S Rhodes-Vivour
(74) *Attorney, Agent, or Firm* — Oblon, McClelland, Maier & Neustadt, L.L.P.

(57) ABSTRACT

A differential amplifier generates an offset correction signal based on a rotation detection signal from a rotation detector apparatus and an offset signal. A comparator compares the offset correction signal with a threshold voltage, and outputs a binarized signal representing the comparison result. An average value signal generator circuit generates an average value signal representing the average value of the offset correction signal. The offset signal generator circuit generates the offset signal so that the signal voltage of the average value signal has a voltage value between a threshold voltage and a threshold voltage.

6 Claims, 18 Drawing Sheets

(51) Int. Cl.
  *H02P 1/00* (2006.01)
  *G01R 1/00* (2006.01)
  *G01D 1/00* (2006.01)

(56) References Cited

U.S. PATENT DOCUMENTS

| | | | | |
|---|---|---|---|---|
| 5,650,719 | A | * | 7/1997 | Moody et al. ................. 324/166 |
| 5,777,468 | A | * | 7/1998 | Maher ....................... 324/207.18 |
| 8,723,512 | B1 | * | 5/2014 | Burdette et al. ......... 324/207.25 |
| 2001/0043151 | A1 | | 11/2001 | Draxelmayr |
| 2002/0124663 | A1 | * | 9/2002 | Tokumoto et al. ....... 73/862.333 |
| 2004/0189285 | A1 | * | 9/2004 | Uenoyama ............... 324/207.12 |
| 2008/0116886 | A1 | * | 5/2008 | Yamada et al. ........... 324/207.21 |

FOREIGN PATENT DOCUMENTS

| | | |
|---|---|---|
| JP | 4 69986 | 3/1992 |
| JP | 4 315876 | 11/1992 |
| JP | 3326933 | 7/2002 |
| JP | 2002 526747 | 8/2002 |
| JP | 2010 32486 | 2/2010 |

OTHER PUBLICATIONS

Office Action issued Sep. 26, 2013 in German Patent Application No. 11 2010 005 302.2 (with English translation).

International Preliminary Report on Patentability and Written Opinion (English translation) issued Sep. 27, 2012 in PCT/JP2010/071249 filed Nov. 29, 2010.

Combined Chinese Office Action and Search Report issued May 21, 2014 in Patent Application No. 201080062967.2 with Partial English Translation and English Translation of Category of Cited Documents.

* cited by examiner

BINARIZATION CIRCUIT FOR BINARIZING DETECTION SIGNAL REPRESENTING ROTATION OR MOVEMENT OF OBJECT

TECHNICAL FIELD

The present invention relates to a binarization circuit for processing a detection signal, that generates a binarized signal based on a detection signal that detects the rotation or movement of an object and changes according to the rotation or movement of the object, and relates to a rotation detector apparatus and a movement detector apparatus each including the binarization circuit for processing the detection signal.

BACKGROUND ART

There has been known rotation detector apparatuses and methods for detecting the number of rotations (rotation speed) and the amount of rotations of a rotating body with using a rotation detection signal outputted from sensors arranged along the rotational direction of the rotating body. Concretely speaking, there has been known a prior art rotation detector apparatus including a plurality of bridge-connected magneto-resistive effect elements arranged along the rotational direction of a rotating body such as a gear, and a binarization circuit for processing a detection signal, that receives a voltage value at a connection point of the magneto-resistive effect elements as a rotation detection signal, binarizes the rotation detection signal, and outputs a resultant signal. In addition, there has been known a prior art movement detector apparatus including a plurality of bridge-connected magneto-resistive effect elements arranged along the movement direction of a moving body such as a rail so as to detect the movement speed and the movement amount of the moving body, on which protruding portions and recess portions are alternately and repeatedly formed, and a binarization circuit for processing a detection signal, that receives a voltage value at a connection point between the magneto-resistive effect elements as a movement detection signal, binarizes the movement detection signal and outputs a resultant signal. Generally speaking, in the prior art rotation detector apparatus and movement detector apparatus, an analog sinusoidal detection signal corresponding to the teeth and valleys of the gear or the protruding portions and the recess portions of the rail is inputted to the binarization circuit. Therefore, by binarizing the detection signal into a binarized signal having a rectangular waveform using a predetermined threshold voltage, it is possible to detect the number of rotations and the amount of rotations of the rotating body or the movement speed and the movement amount of the moving body based on the time cycle and the number of pulses of the binarized signal.

However, since the magneto-resistive effect elements generally have thermal characteristics, the direct current level of the detection signal changes according to changes in the environmental temperature. For the above reasons, there has been such a problem that the detection signal cannot be binarized when, for example, the maximum value of the detection signal is smaller than the threshold voltage and when the minimum value of the detection signal is larger than the threshold voltage. Further, there has been such a problem that, if the above-described direct current level changes, the positions of the rising edges and the falling edges of the binarized signal change even when the detection signal can be binarized, and this leads to reduced edge accuracy. In order to solve such problems, the threshold voltage for binarization is adjusted based on the detection signal in the prior art apparatuses described in Patent Documents 1 to 3.

A data reproducing apparatus described in the Patent Document 1 includes means for reproducing and binarizing a reproduced signal read out from an information recording medium into digital data and means for demodulating the digital data. The data reproducing apparatus changes a predetermined constant of the digital data reproduction means based on a code error rate detected by the demodulating means, and adjusts the constant so that the code error rate becomes the minimum. In this case, the predetermined constant is a slice level of a level comparator for binarizing the reproduced signal with a predetermined level to perform an AND operation with a signal representing a zero-cross position of the signal obtained by differentiating the reproduced signal, and for generating a window pulse.

In addition, in a slice level adjustment circuit described in the Patent Document 2, it is paid attention that a "1" level and a "0" level exist at an even ratio in an EFM (Eight to Fourteen Modulation) signal produced with an accurate slice level, i.e., the average of the duty ratio is 50%. The slice level adjustment circuit automatically adjusts the slice level so that an average of a duty ratio of the EFM signal always becomes 50% by integrating the EFM signal in an integration circuit, comparing an integration output thereof with a reference voltage, and producing a control voltage to set the slice level of a waveform shaping circuit that produces the EFM signal from a high-frequency signal.

Further, a sensor signal processing apparatus described in the Patent Document 3 is characterized by including output correcting means which includes signal amplifying means, signal judging means, periodic signal generating means, counting means and output correcting means, peak and bottom holding means, threshold setting means, and comparing means. The signal amplifying means adds an offset signal to an output signal of a magnetism detection sensor, which detects magnetism, converts detected magnetism into an electric signal and outputs the electric signal as the output signal, and amplifies the output signal. The signal judging means outputs an offset adjustment start signal only when an output signal of the signal amplifying means exceeds a desired upper limit value or lower limit value. The periodic signal generating means outputs a periodic signal according to the offset adjustment start signal. The counting means changes a count value according to the periodic signal. The offset signal outputting means outputs an offset signal corresponding to the count value. The peak and bottom holding means holds a peak value and a bottom value of an output signal from the output correcting means. The threshold setting means sets a threshold value according to the peak value and the bottom value from the peak and bottom holding means. The comparing means compares an output signal from the output correcting means with the threshold value set by the threshold setting means, and outputs a binarized signal based a magnitude relation between the same signals.

The sensor signal processing apparatus described in the Patent Document 3 is configured to output the offset adjustment start signal to operate the periodic signal generating means only when the output signal of the signal amplifying means exceeds the desired upper limit value or the lower limit value. Therefore, when the output of the magnetism detection sensor changes and needs to be corrected, the output correcting means corrects the output of the magnetism detection sensor. If the output of the magnetism detection sensor is corrected so as not to exceed the desired upper limit value or the lower limit value, then the subsequent correcting operation is stopped. Namely, the periodic signal generating means to output the periodic signal for correcting the output is to be stopped. Then, since the periodic signal generating means to output the periodic signal for correcting the output is stopped at a timing at which the output signal from the output correcting means is compared with the threshold value set from the peak value and the bottom value by the peak and bottom holding means and the binarized signal is outputted, it is possible to prevent the degradation in the angular accuracy due to oscillation spike noises.

CITATION LIST

Patent Document

Patent Document 1: Japanese patent laid-open publication No. JP 4-315876 A.
Patent Document 2: Japanese patent laid-open publication No. JP 59-008112 A.
Patent Document 3: Japanese patent No. 3326933.

SUMMARY OF INVENTION

Technical Problem

However, the data reproducing apparatus described in the Patent Document 1 adjusts the slice level for binarizing the reproduced signal based on the code error rate of the demodulated signal of the reproduced signal read out from the information recording medium. In addition, the slice level adjusting circuit described in the Patent Document 2 adjusts the slice level based on the duty ratio of the EFM signal after reproduction. Therefore, there has been such a problem that the data reproducing apparatus described of the Patent Document 1 and the slice level adjusting circuit described of the Patent Document 2 cannot be applied to a detection signal which does not include digital data such as a detection signal outputted from a rotation detector apparatus for detecting the revolution of the engine of an automobile.

Further, since the sensor signal processing apparatus described in the Patent Document 3 corrects the rotation detection signal from the rotation detecting sensor so that the rotation detection signal becomes larger than the predetermined lower limit value and smaller than the predetermined upper limit value, there has been such a problem that the edge positions of the binarized signal change according to changes in the amplitude of the rotation detection signal before correction, and the edge accuracy is deteriorated. In addition, the threshold voltage for the binarization is set based on the peak value and the bottom value of the rotation detection signal after correction. Therefore, there has been such a problem that the threshold voltage becomes larger than the maximum value of the output signal and the rotation detection signal cannot be binarized, when spike noises are superimposed on the rotation detection signal.

It is an object of the present invention to provide a binarization circuit for processing a detection signal, a rotation detector apparatus including the binarization circuit for processing the detection signal and a movement detector apparatus including the binarization circuit for processing the detection signal, each capable of solving the above-described problems and capable of generating a binarized signal, which detects the rotation or movement of an object and changes according to the rotation or movement of the object, with reliability higher than that of the prior art even when the signal level of the detection signal changes or when spike noises are superimposed on the detection signal.

Solution to Problem

Each of the binarization circuit for processing the detection signal, the rotation detector apparatus and the movement detector apparatus of the present invention is characterized by including the following:

offset correction signal generating means that generates, based on an inputted offset signal and a first detection signal, an offset correction signal representing a difference between the first detection signal and an offset signal, the first detection signal detecting one of rotation and movement of an object and changing according to the one of rotation and movement of the object;

first comparing means that compares the offset correction signal with a predetermined first threshold voltage, and outputs a binarized signal representing a comparison result;

average value signal generating means that generates an average value signal representing an average value of the offset correction signal; and offset signal generating means that compares a signal voltage of the average value signal with a predetermined second threshold voltage and a third threshold voltage that is larger than the second threshold voltage, and generates the offset signal so that the signal voltage of the average value signal has a voltage value between the second threshold voltage and the third threshold voltage.

Advantageous Effects of Invention

Each of the binarization circuit for processing the detection signal, the rotation detector apparatus and the movement detector apparatus of the present invention includes the offset signal generating means that comparers the signal voltage of the average value signal with the predetermined second threshold value and the third threshold value larger than the second threshold value, and generates the offset signal so that the signal voltage of the average value signal has a voltage value between the second threshold voltage and the third threshold value. Therefore, it is possible to generate the binarized signal based on the first detection signal with reliability higher than that of the prior art.

DESCRIPTION OF EMBODIMENTS

Figure 1:
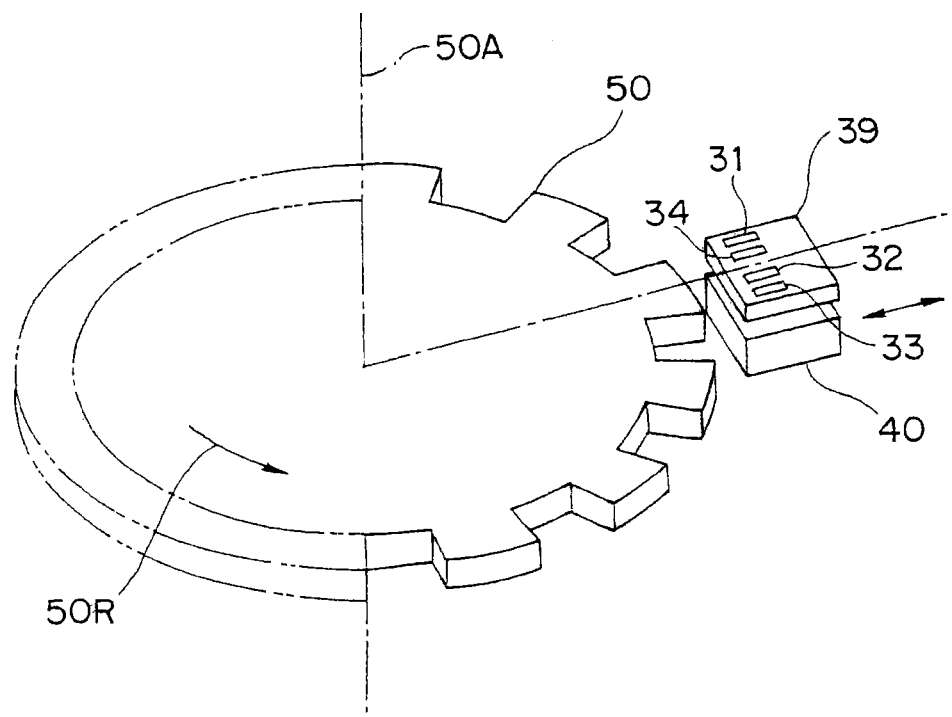
FIG. 1 is a perspective view showing a magneto-resistive effect element unit 39, a magnet 40 and a gear 50 of a rotation detector apparatus 10 according to a first embodiment of the present invention.

Embodiments of the present invention will be described hereinafter with reference to the drawings. In the preferred embodiments, components similar to each other are denoted by the same reference numerals.

First Embodiment

Figure 2:
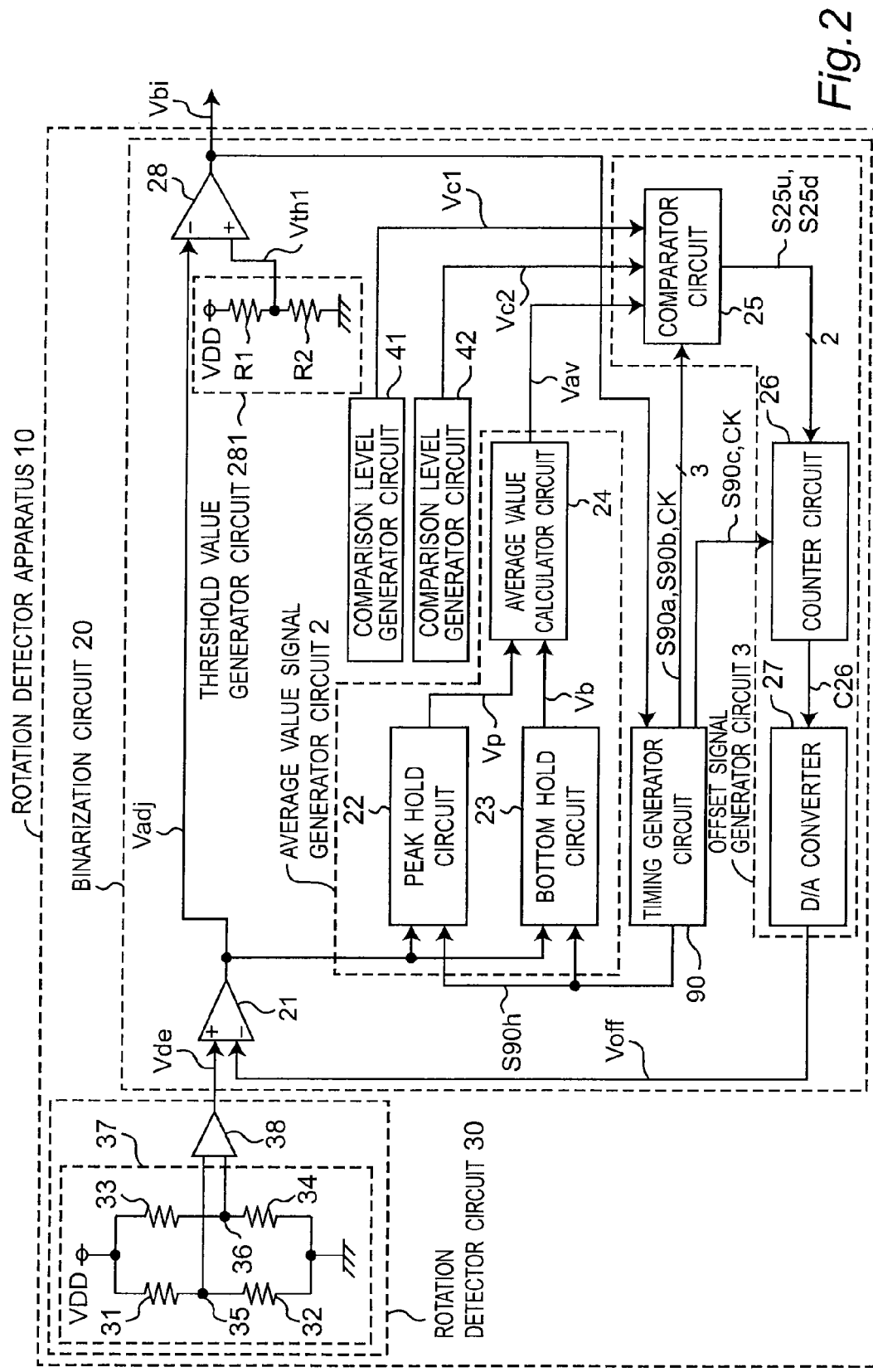
FIG. 2 is a block diagram showing a configuration of the rotation detector apparatus 10 of the first embodiment of the present invention.
Figure 3:
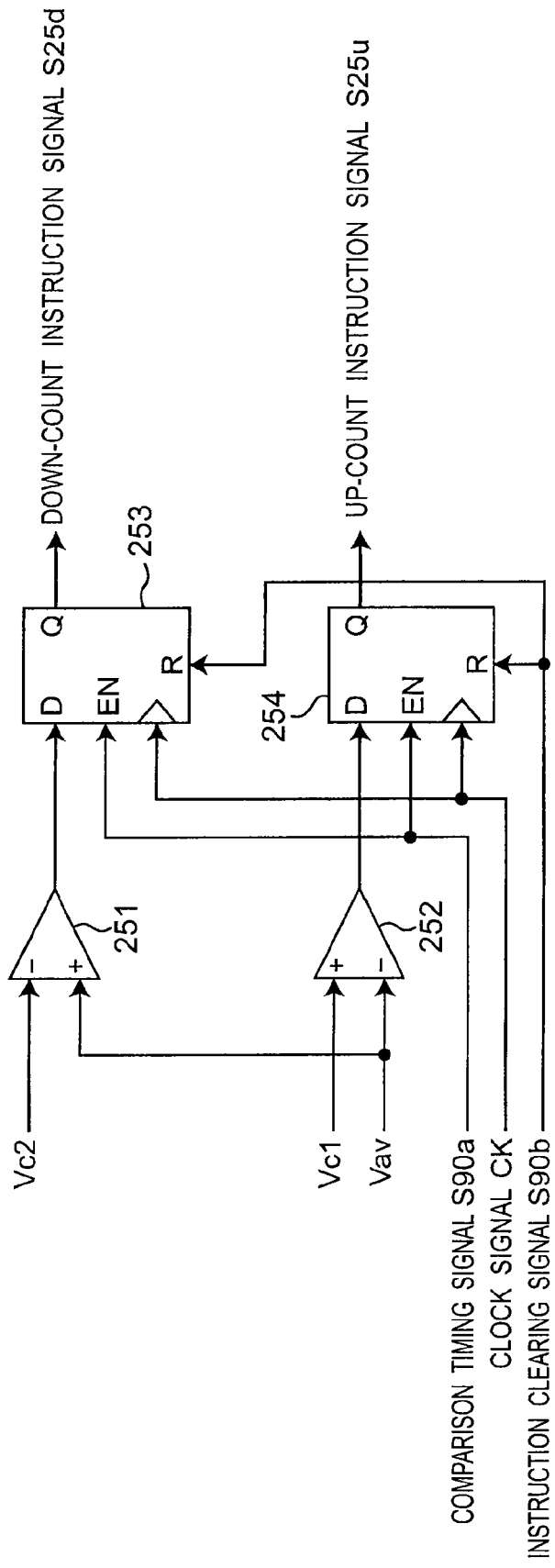
FIG. 3 is a circuit diagram showing a configuration of a comparator 25 of FIG. 2.
Figure 4:
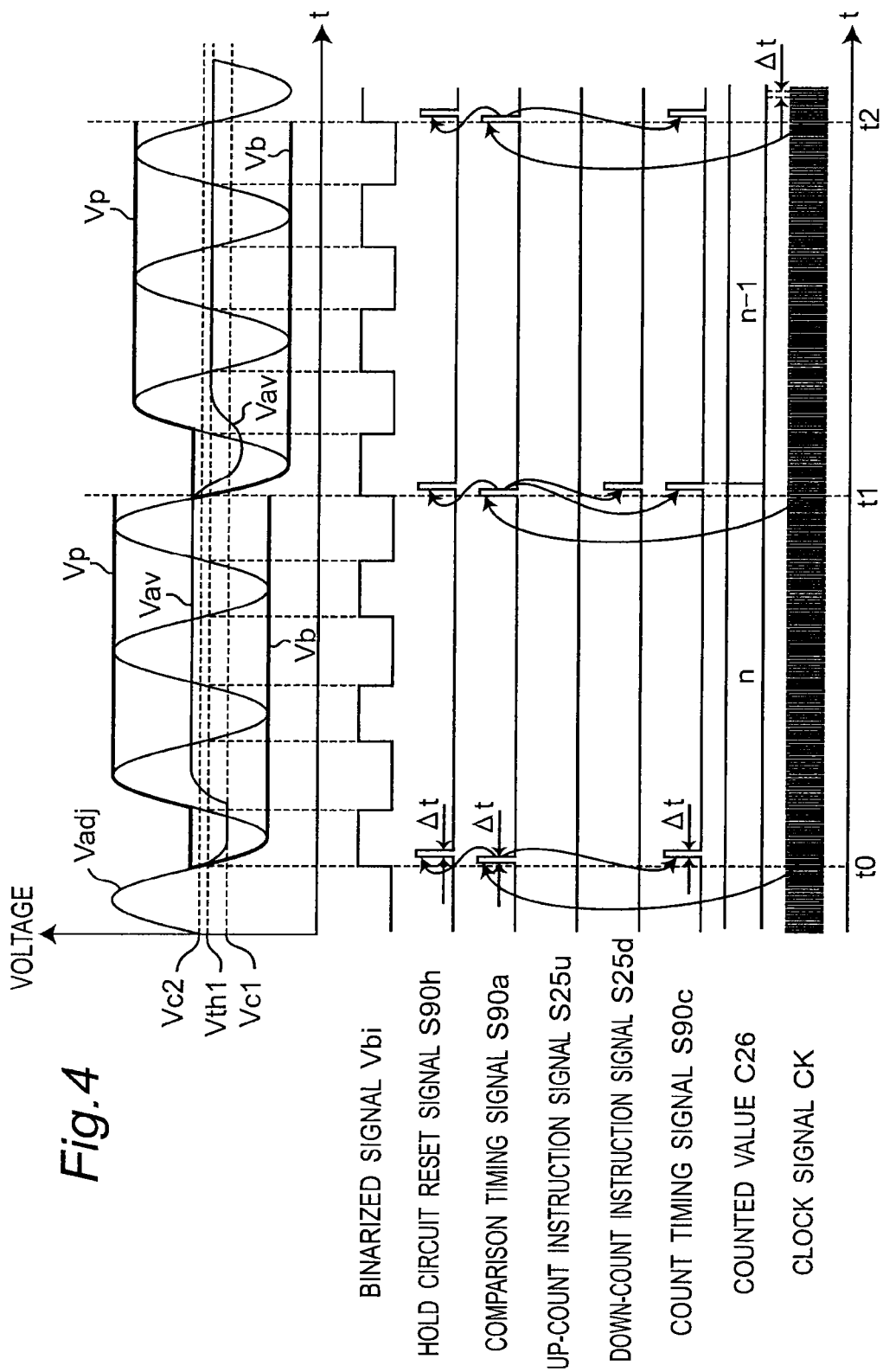
FIG. 4 is a timing chart showing an operation of the rotation detector apparatus 10 of FIG. 2.

FIG. 1 is a perspective view showing a magneto-resistive effect element unit 39, a magnet 40 and a gear 50 of a rotation detector apparatus 10 according to the first embodiment of the present invention, and FIG. 2 is a block diagram showing a configuration of the rotation detector apparatus 10 of the first embodiment of the present invention. FIG. 3 is a circuit diagram showing a configuration of a comparator 25 of FIG. 2, and FIG. 4 is a timing chart showing an operation of the rotation detector apparatus 10 of FIG. 2.

As described later in detail, the rotation detector apparatus 10 of the present embodiment is configured to include a rotation detector circuit 30 that detects the rotation of the gear 50 and generates a rotation detection signal Vde representing the rotation speed and the amount of rotations of the gear 50, and a binarization circuit 20 for processing the rotation detection signal. In this case, the binarization circuit 20 is characterized by including the following:

(a) a differential amplifier 21 which is an offset correction signal generating means that generates an offset correction signal Vadj representing a difference between the rotation detection signal Vde and an offset signal Voff based on the rotation detection signal Vde and an inputted offset signal Voff, first comparing means that compares the offset correction signal with a predetermined first threshold voltage, and outputs a binarized signal representing a comparison result;

(b) an average value signal generator circuit 2 that generates an average value signal Vav representing an average value of the offset correction signal Vadj; and (c) an offset signal generator circuit 3 that compares the signal voltage of the average value signal Vav with a predetermined threshold voltage Vc1 and a threshold voltage Vc2 larger than the threshold voltage Vc1, and generates the offset signal Voff so that the signal voltage of the average value signal Vav has a voltage value between the threshold voltage Vc1 and the threshold voltage Vc2.

Referring to FIG. 1, the gear 50 made of a magnetic material is provided for a rotating body such as a crankshaft of an engine of an automobile, and rotating in a rotational direction 50R about a rotation axis 50A. The magnet 40 magnetized in the direction of the rotation axis 50A of the gear 50 is arranged so as to face the gear 50 with a predetermined spacing between the magnet 40 and the gear 50. The magnet 40 generates a bias magnetic field and applies the bias magnetic field to the magneto-resistive effect element unit 39. The magneto-resistive effect element unit 39 is arranged so as to face the gear 50 with a predetermined spacing between the magneto-resistive effect element unit 39 and the magnet 40, and a predetermined spacing between the magneto-resistive effect element unit 39 and the gear 50. Magneto-resistive effect elements 31, 32, 33 and 34 are arranged on the surface of the magneto-resistive effect element unit 39 along the rotational direction 50R of the gear 50, with a predetermined spacing.

When the gear 50 rotates, the teeth portions and the valley portions of the gear 50 alternately face the magneto-resistive effect element unit 39. Therefore, the bias magnetic field applied from the magnet 40 to the magneto-resistive effect element unit 39 changes, and the resistance values of the magneto-resistive effect elements 31, 32, 33 and 34 change in response to this.

Referring to FIG. 2, the rotation detector apparatus 10 is configured to include the rotation detector circuit 30 that detects the rotation of the gear 50 of FIG. 1 and generates and outputs the rotation detection signal Vde, and the binarization circuit 20 that binarizes the rotation detection signal Vde and outputs a resultant signal as a binarized signal Vbi. In this case, the rotation detector circuit 30 is configured to include the magneto-resistive effect element unit 39 of FIG. 1 and a differential amplifier 38. The magneto-resistive effect element unit 39 includes a bridge circuit 37 including the magneto-resistive effect elements 31, 32, 33 and 34. The magneto-resistive effect elements 31 and 32 are connected in series via a connection point 35 between a positive power voltage VDD and the ground potential, the magneto-resistive effect elements 33 and 34 are connected in series via a connection point 36 between the positive power voltage VDD and the ground potential, and the connection points 35 and 36 are connected to input terminals of the differential amplifier 38, respectively. Further, an output signal from the differential amplifier 38 is outputted to the binarization circuit 20 as the rotation detection signal Vde. When the gear 50 rotates, the rotation detector circuit 30 generates the rotation detection signal Vde that includes a sinusoidal signal component having a frequency of a value obtained by multiplying the number of rotations of the gear 50 by the number of crests or valleys of the gear 50, in response to changes in the resistance values of the magneto-resistive effect elements 31, 32, 33 and 34, and outputs the rotation detection signal Vde to the binarization circuit 20. In this case, the frequency of the sinusoidal signal component included in the rotation detection signal Vde corresponds to the number of rotations of the gear 50, and the number of peaks (or bottoms) of the sinusoidal signal component from a predetermined timing corresponds to the amount of rotations of the gear 50 from the same timing.

Referring to FIG. 2, the binarization circuit 20 is configured to include a differential amplifier 21, an average value signal generator circuit 2, an offset signal generator circuit 3, a comparator 28, a threshold value generator circuit 281, two comparison level generator circuits 41 and 42, and a timing generator circuit 90. In this case, the average value signal generator circuit 2 is configured to include a peak hold circuit 22, a bottom hold circuit 23, and an average value calculator circuit 24. The offset signal generator circuit 3 is configured to include a comparator circuit 25, a counter circuit 26, and a digital-to-analog converter 27 (digital-to-analog conversion is referred to as D/A conversion hereinafter). In addition, as shown in FIG. 3, the comparator circuit 25 is configured to include comparators 251 and 252, and flip-flop circuits 253 and 254.

Referring to FIG. 2, the threshold value generator circuit 281 includes resistors R1 and R2 connected in series between the power voltage VDD and the ground potential, generates a predetermined threshold voltage Vth1 by dividing the power voltage VDD at a ratio expressed by the ratio of the resistance values of the resistors R1 and R2, and outputs the threshold voltage Vth1 to a non-inverted input terminal of the comparator 28. In addition, the comparison level generator circuit 41 generates a predetermined comparison voltage Vc1, and outputs the comparison voltage Vc1 to a non-inverted input terminal of the comparator 252 of the comparator circuit 25. On the other hand, the comparison level generator circuit 42 generates a predetermined comparison voltage Vc2, and outputs the comparison voltage Vc2 to an inverted input terminal of the comparator 251 of the comparator circuit 25. In this case, the comparison voltage Vc1 is set to a value smaller than the threshold voltage Vth1, and the comparison voltage Vc2 is set to a value larger than the threshold voltage Vth1.

In addition, referring to FIGS. 2 and 4, the timing generator circuit 90 is a control circuit that controls operations of the peak hold circuit 22, the bottom hold circuit 23, the comparator circuit 25 and the counter circuit 26. The timing generator circuit 90 generates a clock signal CK having a predetermined time cycle $\Delta t$, and outputs the clock signal CK to clock input terminals of the flip-flop circuits 253 and 254 (See FIG. 3) of the comparator circuit 25, and the counter circuit 26. In addition, the timing generator circuit 90 detects each rising edge of the binarized signal Vbi outputted from the comparator 28, generates a comparison timing signal S90a, and outputs the comparison timing signal S90a to enable input terminals of the flip-flop circuits 253 and 254 of the comparator circuit 25. In this case, the comparison timing signal S90a has a pulse shape of a pulse width $\Delta t$ and rises at the timing of the rising edge of the clock signal CK immediately after the rise of the binarized signal Vbi, every time cycle (e.g., at timings t0, t1, t2, . . . of FIG. 4) three times the time cycle of the binarized signal Vbi, where the time cycle of the binarized signal Vbi is assumed to be the timing interval between rising edges. Further, the timing generator circuit 90 generates a hold circuit reset signal S90h that rises at the timing of the falling edge of the comparison timing signal S90a and has a pulse shape of the pulse width $\Delta t$, and outputs the hold circuit reset signal S90h to the peak hold circuit 22 and the bottom hold circuit 23. Then, the timing generator circuit 90 generates a count timing signal S90c in a manner similar to that of the hold circuit reset signal S90h, and outputs the count timing signal S90c to the counter circuit 26. Further, the timing generator circuit 90 generates an instruction clearing signal S90b that rises at the timing of the falling edge of the count timing signal S90c and has a pulse shape of the pulse width $\Delta t$, and outputs the instruction clearing signal S90b to reset input terminals of the flip-flop circuits 253 and 254 of the comparator circuit 25. As shown in FIG. 4, it is noted that the time cycle $\Delta t$ of the clock signal CK is set to a value sufficiently smaller than the time cycle of the binarized signal Vbi when the gear 50 is rotating. By configuring the timing generator circuit 90 as described above, the timing generator circuit 90 controls the average value signal generator circuit 2 and the offset signal generator circuit 3 so as to generate the offset signal Voff at the timings of t0, t1, t2, . . . of FIG. 4, for example.

In addition, referring to FIG. 2, the differential amplifier 21 is an offset correction signal generating means. The differential amplifier 21 subtracts the offset signal Voff from the D/A converter 27 from the rotation detection signal Vde from the rotation detector circuit 30 and amplifies a resultant signal so as to generate an offset correction signal Vadj of subtraction and amplification results, and outputs the offset correction signal Vadj to an inverted input terminal of the comparator 28. The comparator 28 compares the signal voltage of the offset correction signal Vadj with the threshold voltage Vth1, generates a binarized signal Vbi having a low-level when the signal voltage of the offset correction signal Vadj is larger than the threshold voltage Vth1, generates a binarized signal Vbi having a high-level when the signal voltage of the offset correction signal Vadj is smaller than the threshold voltage Vth1, and outputs the binarized signal Vbi.

Further, referring to FIG. 2, the peak hold circuit 22 is reset at the timing of each rising edge of the hold circuit reset signal S90h, detects and holds the peak value of the offset correction signal Vadj, and outputs a peak value signal Vp of the detected held result to the average value calculator circuit 24. On the other hand, the bottom hold circuit 23 is reset at the timing of each rising edge of the hold circuit reset signal S90h, detects and holds the bottom value of the offset correction signal Vadj, and outputs a bottom value signal Vb of the detected held result to the average value calculator circuit 24. The average value calculator circuit 24 generates an average value signal Vav representing an average value of the peak value and the bottom value of the offset correction signal Vadj by summing up the peak value signal Vp and the bottom value signal Vb and thereafter dividing a resultant value by two, and outputs the average value signal Vav to a non-inverted input terminal of the comparator circuit 251 and an inverted input terminal of the comparator circuit 252 of the comparator circuit 25.

In addition, in the comparator circuit 25 of FIG. 3, an output signal from the comparator circuit 251 is outputted to a data input terminal of the flip-flop circuit 253, and an output signal from the comparator circuit 252 is outputted to a data input terminal of the flip-flop circuit 254. Then, a down-count instruction signal S25d is outputted from the Q output terminal of the flip-flop circuit 253 to a counter circuit 26, and an up-count instruction signal S25u is outputted from the Q output terminal of the flip-flop circuit 254 to the counter circuit 26.

In addition, referring to FIG. 2, the counter circuit 26 detects the voltage levels (signal voltages) of the up-count instruction signal S25u and the down-count instruction signal S25d in response to the count timing signal S90c having the high-level. Then, the counter circuit 26 increments a counted value C26 by one in response to the up-count instruction signal S25u having the high-level at the timing of the rising edge of the clock signal CK, decrements the counted value C26 by one in response to the down-count instruction signal S25d having the high-level, and outputs the counted value C26 to the D/A converter 27. The D/A converter 27 converts the inputted counted value C26 into an analog signal, and outputs the analog signal to an inverted input terminal of the differential amplifier 21 as the offset signal Voff. It is noted that the variation in the voltage level of the output signal Voff from the D/A converter 27 when the inputted counted value C26 changes by one bit is referred to as a resolution Wr of the D/A converter 27.

Next, the operation of the rotation detector apparatus 10 is described with reference to FIG. 4. Referring to FIG. 4, the timing generator circuit 90 generates the hold circuit reset signal S90h, the comparison timing signal S90a, the instruction clearing signal S90b and the count timing signal S90c based on the timings t0, t1, and t2 at the rising edges of the binarized signal Vbi. In this case, the timing t1 is a timing of a rising edge after three time cycles from the timing t0 at the rising edge of the binarized signal Vbi, and the timing t2 is a timing of a rising edge after three time cycles from the timing t1 at the rising edge of the binarized signal Vbi. Referring to FIG. 4, the voltage level of the average value signal Vav is larger than the comparison voltage Vc2 at the timing t1, and therefore, the down-count instruction signal S25d having the high-level is generated. In response to this, the counter circuit 26 decrements the counted value C26 by one from n (where n is an integer) to n−1, and outputs the counted value C26 to the D/A converter 27. As a result, the voltage level of the offset signal Voff is lowered, and the voltage level of the offset correction signal Vadj is also lowered. In addition, the voltage level of the average value signal Vav is larger than the comparison voltage Vc1 and smaller than the comparison voltage Vc2 at the timing t2, and therefore, the respective voltage levels of the up-count instruction signal S25u and the down-count instruction signal S25d are low-level. Therefore, the counted value C26 is neither incremented nor decremented at the timing t2, and the voltage level of the offset signal Voff is maintained.

As described above, according to the present embodiment, the voltage level of the offset signal Voff is changed so that the voltage level of the average value signal Vav generated based on the offset correction signal Vadj becomes larger than the comparison voltage Vc1 and smaller than the comparison voltage Vc2. Therefore, it is possible to binarize the rotation detection signal Vde, which does not include digital data, to generate the binarized signal Vbi with accurately higher than that of the prior art. In addition, even when the voltage level of the rotation detection signal Vde fluctuates due to changes in the environmental temperature, it is always possible to generate the binarized signal Vbi having the duty ratio of 50% with reliably higher than that of the prior art. In addition, at the timings (e.g., the timings t0, t1 and t2 of FIG. 4) at which the offset signal Voff is changed, the signal voltage of the offset signal Voff changes by the predetermined voltage Wr corresponding to the resolution of the D/A converter 27 regardless of the magnitude of a difference between the average value signal Vav and the comparison voltages Vc1 and Vc2. Therefore, even when a noise of a large amplitude such as a spike noise having a relatively small time cycle is superimposed on the rotation detection signal Vde, the signal voltage of the offset signal Voff changes only by the predetermined variation Wr that is smaller than the amplitude of the spike noise, and therefore, it is possible to generate the binarized signal Vbi with reliably higher than that of the prior art. Further, after the voltage level of the average value signal Vav becomes larger than the comparison voltage Vc1 and smaller than the comparison voltage Vc2, the counter circuit 26 does not execute the count operation, and therefore, the voltage level of the offset signal Voff does not change, and the edge positions of the binarized signal Vbi also become stable.

In the present embodiment, the comparison voltage Vc1 is set to a value smaller than the threshold voltage Vth1, and the comparison voltage Vc2 is set to a value larger than the threshold voltage Vth1, however, the present invention is not limited to this. In addition, the timing generator circuit 90 generates the respective signals S90h, S90a, S90b and S90c with the time cycle three times the time cycle of the binarized signal Vbi, however, the present invention is not limited to this. The timing generator circuit 90 may generate the respective signals S90h, S90a, S90b and S90c with a time cycle equal to or two or more times the time cycle of the binarized signal Vbi.

In addition, in the present invention, the threshold value generator circuit 281 and the comparison level generator circuits 41 and 42 are provided inside the binarization circuit 20, however, the present invention is not limited to this. The threshold value generator circuit 281 and the comparison level generator circuits 41 and 42 may be provided outside the binarization circuit 20.

Further, in the present invention, each of the hold circuit reset signal S90h and the count timing signal S90c is a signal that rises at the falling edge of the comparison timing signal S90a and has the pulse shape of the pulse width Δt in the present embodiment, however, the present invention is not limited to this. The hold circuit reset signal S90h and the count timing signal S90c are required to be generated after the comparison timing signal S90a, and are not required to be generated immediately after the comparison timing signal S90a.

Second Embodiment

Figure 5:
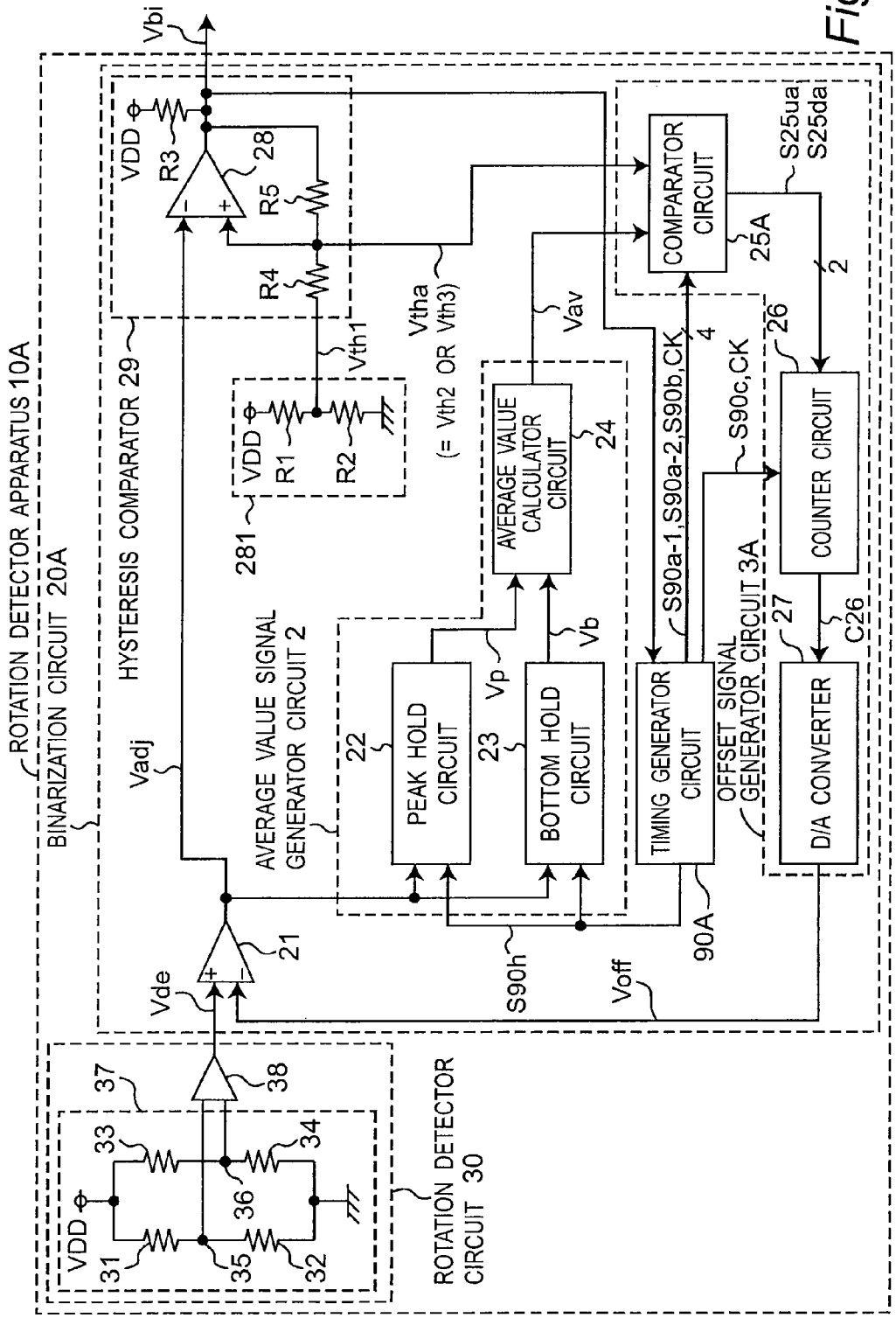
FIG. 5 is a block diagram showing a configuration of a rotation detector apparatus 10A according to a second embodiment of the present invention.
Figure 6:
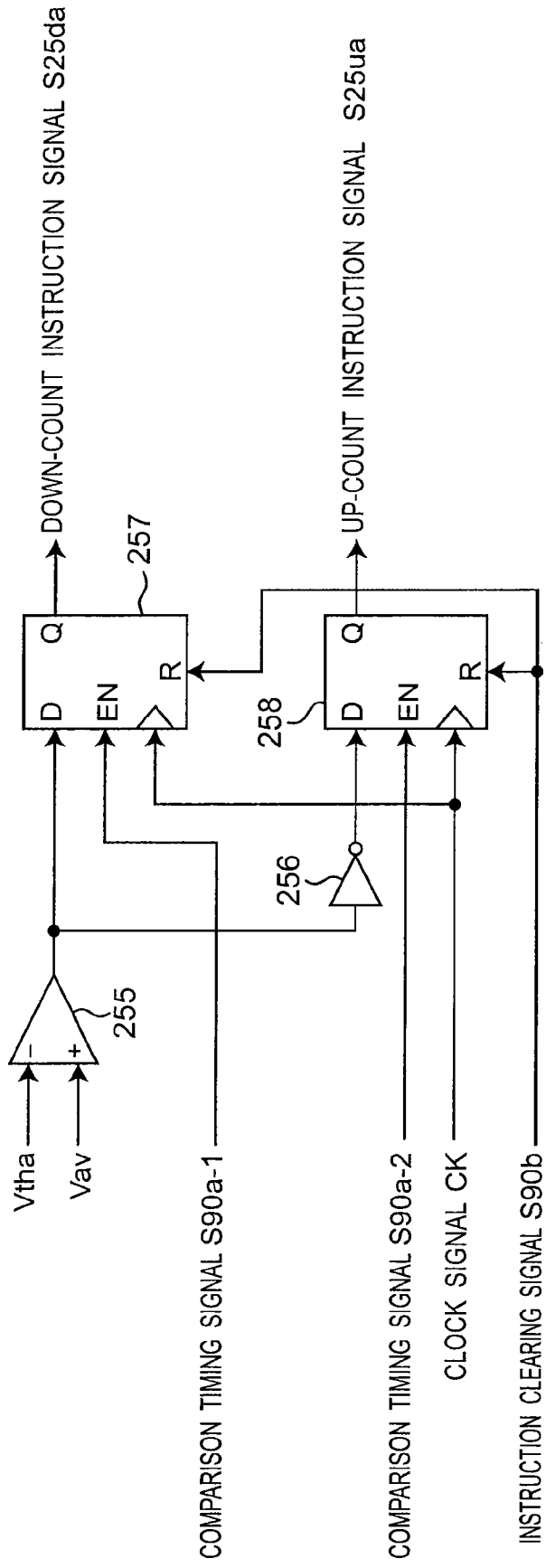
FIG. 6 is a circuit diagram showing a configuration of a comparator circuit 25A of FIG. 5.

FIG. 5 is a block diagram showing a configuration of a rotation detector apparatus 10A according to the second embodiment of the present invention, and FIG. 6 is a circuit diagram showing a configuration of the comparator circuit 25A of FIG. 5. The rotation detector apparatus 10A of the present embodiment includes a binarization circuit 20A instead of the binarization circuit 20 as compared with the rotation detector apparatus 10 of the first embodiment. In this case, the binarization circuit 20A is characterized by including a hysteresis comparator 29 having a hysteresis characteristic instead of the comparator 28, a timing generator circuit 90A instead of the timing generator circuit 90, and an offset signal generator circuit 3A instead of the offset signal generator circuit 3 as compared with the binarization circuit 20. The offset signal generator circuit 3A is configured to include the comparator circuit 25A instead of the comparator circuit 25 as compared with the offset signal generator circuit 3. In this case, referring to FIG. 6, the comparator circuit 25A is configured to include a comparator 255, an inverter 256, and flip-flop circuits 257 and 258. The timing generator circuit 90A is a control circuit that controls operations of the peak hold circuit 22, the bottom hold circuit 23, the comparator circuit 25A, and the counter circuit 26.

Figure 12:
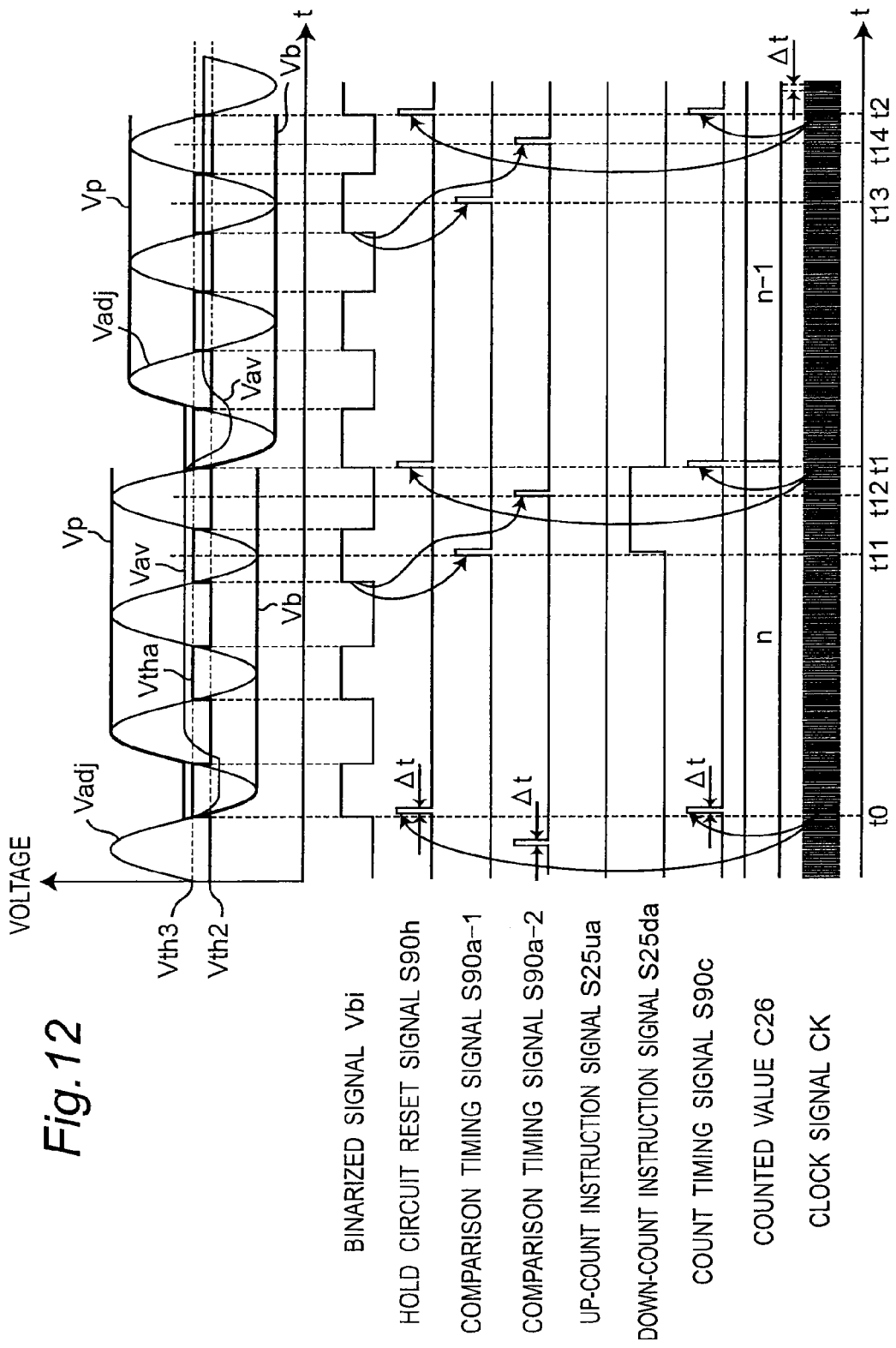
FIG. 12 is a timing chart showing an operation of the rotation detector apparatus 10A of FIG. 5.

Referring to FIG. 5, the hysteresis comparator 29 is configured to include the comparator 28, a resistor R4 connected between the non-inverted input terminal of the comparator 28 and the connection point of the resistors R1 and R2, a resistor R5 that is a feedback resistor connected between the non-inverted input terminal of the comparator 28 and the output terminal of the comparator 28, and a resistor R3 connected between the positive power voltage VDD and the output terminal of the comparator 28. In this case, a threshold voltage Vtha outputted to the non-inverted input terminal of the comparator 28 is set to a threshold voltage Vth2 smaller than the threshold voltage Vth1 outputted from the threshold value generator circuit 281 or a threshold voltage Vth3 larger than the threshold voltage Vth1 as shown in FIG. 12. Concretely speaking, the threshold voltage Vtha is set to the threshold voltage Vth3 for a period during which the binarized signal Vbi has the high-level, and the threshold voltage Vtha is set to the threshold voltage Vth2 for a period during which the binarized signal Vbi has the low-level. By configuring the hysteresis comparator 29 as described above, the comparator 28 compares the offset correction signal Vadj with the threshold voltage Vth2 or the threshold voltage Vth3 by setting the threshold voltage Vtha selectively to the threshold voltage Vth2 or the threshold voltage Vth3 according to the voltage level of the binarized signal Vbi based on the threshold voltage Vth1 and the binarized signal Vbi, and outputs the binarized signal Vbi representing the comparison result. In addition, the hysteresis comparator 29 outputs the threshold voltage Vtha selectively set to the threshold voltage Vth2 or the threshold voltage Vth3 as described above, to the non-inverted input terminal of the comparator 255 of the comparator circuit 25A. It is noted that magnitude of a difference (Vth3-Vth2) between the threshold voltages Vth2 and Vth3 is called the hysteresis width Wh, and the hysteresis width Wh is determined based on the ratio of the resistance values of the resistors R4 and R5.

Figure 7:
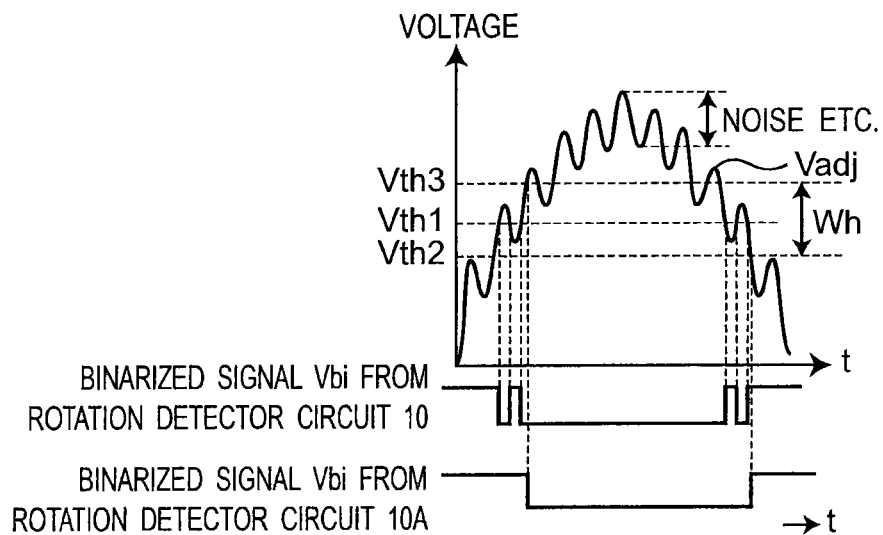
FIG. 7 is a graph showing an operation of a hysteresis comparator 29 of FIG. 5.

FIG. 7 is a graph showing the operation of the hysteresis comparator 29 of FIG. 5. As shown in FIG. 7, in such a case where noises are superimposed on the offset correction signal Vadj, noises having short time cycle are superimposed on the binarized signal Vbi outputted from the comparator 28 of the rotation detector apparatus 10 of the first embodiment, when the voltage level of the offset correction signal Vadj changes from a voltage smaller than the threshold voltage Vth1 to a voltage larger than the threshold voltage Vth1 and when the voltage level of the offset correction signal Vadj changes from a voltage larger than the threshold voltage Vth1 to a voltage smaller than the threshold voltage Vth1. On the other hand, according to the present embodiment, the voltage level of the binarized signal Vbi changes from the high-level to the low-level when the voltage level of the offset correction signal Vadj exceeds the threshold voltage Vth3, and the voltage level of the binarized signal Vbi changes from the low-level to the high-level when the voltage level of the offset correction signal Vadj falls below the threshold voltage Vth2. Therefore, even if a noise having amplitude smaller than the hysteresis width Wh is superimposed on the offset correction signal Vadj, the noise having a short time cycle is not superimposed on the binarized signal Vbi.

Referring to FIG. 5, the timing generator circuit 90A generates a clock signal CK having a predetermined time cycle Δt, and outputs the clock signal CK to a clock input terminals (See FIG. 6) of the flip-flop circuits 257 and 258 of the comparator circuit 25A, and to the counter circuit 26. In addition, the timing generator circuit 90A detects each rising edge of the binarized signal Vbi outputted from the comparator 28, generates a hold circuit reset signal S90h and a count timing signal S90c, outputs the hold circuit reset signal S90h to the peak hold circuit 22 and the bottom hold circuit 23, and outputs the count timing signal S90c to the counter circuit 26. In this case, each of the hold circuit reset signal S90h and the count timing signal S90c has a pulse shape of a pulse width Δt and rises at the timing of the rising edge of the clock signal CK immediately after the rise of the binarized signal Vbi, every time cycle three times the time cycle of the binarized signal Vbi, where the time cycle of the binarized signal Vbi is assumed to be the timing interval between rising edges. Further, the timing generator circuit 90A generates an instruction clearing signal S90b that rises at the timing of the falling edge of the count timing signal S90c and has a pulse shape of the pulse width Δt, and outputs the instruction clearing signal S90b to reset input terminals of the flip-flop circuits 257 and 258 of the comparator circuit 25.

Further, referring to FIG. 5, the timing generator circuit 90A generates a comparison timing signal S90a-1 having a pulse shape of the pulse width Δt, at a timing immediately after the timing of the rising edge of the binarized signal Vbi after the time cycle two times the time cycle of the binarized signal Vbi from the generation of the hold circuit reset signal S90h and within a period during which the voltage level of the binarized signal Vbi is the high-level (See FIG. 12), and outputs the comparison timing signal S90a-1 to an enable input terminal of the flip-flop circuit 257 of the comparator circuit 25A. In addition, the timing generator circuit 90A generates a comparison timing signal S90a-2 having a pulse shape of the pulse width Δt, at a timing immediately after the timing of the rising edge after the time cycle two times the time cycle of the binarized signal Vbi from the generation of the hold circuit reset signal S90h and within a period during which the voltage level of the binarized signal Vbi is the low-level (See FIG. 12), and outputs the comparison timing signal S90a-2 to the enable input terminal of the flip-flop circuit 258 of the comparator circuit 25A.

Referring to FIG. 6, the average value signal Vav is outputted to a non-inverted input terminal of the comparator 255, and the threshold voltage Vtha is outputted to an inverted input terminal of the comparator 255. Further, an output signal from the comparator 255 is outputted to a data input terminal of the flip-flop circuit 257, and also outputted to a data input terminal of the flip-flop circuit 258 via an inverter 256. Then, the flip-flop circuit 257 generates a down-count instruction signal S25da, and outputs the down-count instruction signal S25da from a Q-output terminal to the counter circuit 26. On the other hand, the flip-flop circuit 258 generates an up-count instruction signal S25ua, and outputs the up-count instruction signal S25ua from a Q-output terminal to the counter circuit 26. By configuring the comparator circuit 25A as described above, the comparator circuit 25A compares the average value signal Vav with the threshold voltage Vth3 in the time period during which the threshold voltage Vtha is the threshold voltage Vth3, and generates the down-count instruction signal S25da having the high-level when the average value signal Vav is larger than the threshold voltage Vth3. In addition, the comparator circuit 25A compares the average value signal Vav with the threshold voltage Vth2 in a time period during which the threshold voltage Vtha is the threshold voltage Vth2, and generates the up-count instruction signal S25ua having the high-level when the average value signal Vav is smaller than the threshold voltage Vth2.

Referring to FIG. 5, the counter circuit 26 detects the voltage levels of the up-count instruction signal S25ua and the down-count instruction signal S25da in response to the count timing signal S90c having the high-level. Then, the counter circuit 26 increments the counted value C26 by one in response to the up-count instruction signal S25ua having the high-level at the timing of the rising edge of the clock signal CK. On the other hand, the counter circuit 26 decrements the counted value C26 by one in response to the down-count instruction signal S25da having the high-level, and outputs the counted value C26 to the D/A converter 27. It is noted that the counter circuit 26 does neither increment nor decrement the counted value C26 in response to the up-count instruction signal S25ua having the low-level and the down-count instruction signal S25da having the low-level.

Figure 8:
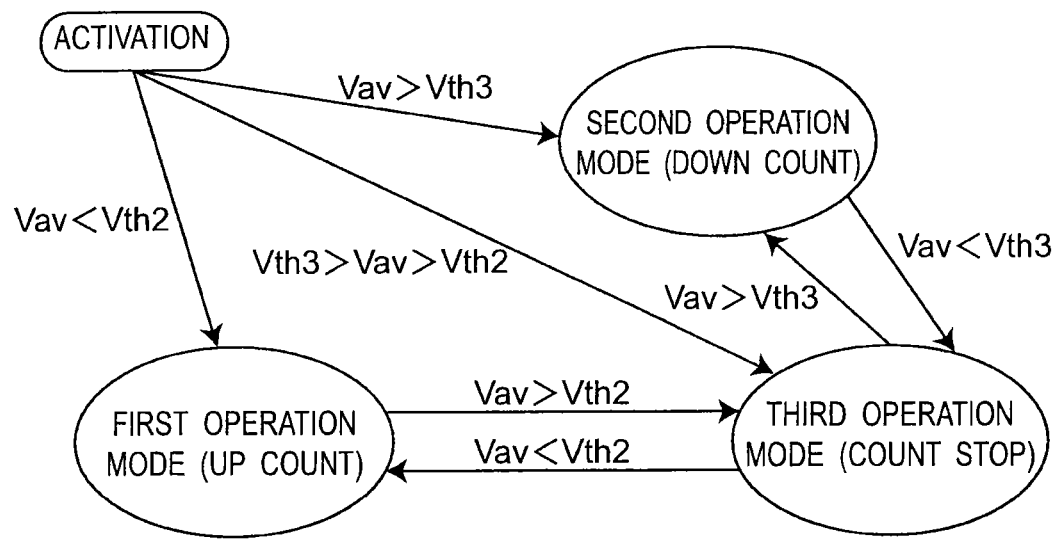
FIG. 8 is a state transition diagram showing an operation of an offset signal generator circuit 3A of FIG. 5.

FIG. 8 is a state transition diagram showing an operation of the offset signal generator circuit 3A of FIG. 5. As shown in FIG. 8, the offset signal generator circuit 3A shifts to a first operation mode in which up-count operation is executed to increment the counted value C26 when the voltage level of the average value signal Vav is smaller than the threshold voltage Vth2. The offset signal generator circuit 3A shifts to a second operation mode in which down-count operation is executed to decrement the counted value C26 when the voltage level of the average value signal Vav is larger than the threshold voltage Vth3. Further, the offset signal generator circuit 3A shifts to a third operation mode in which the count operation is stopped without incrementing and decrementing the counted value C26 when the voltage level of the average value signal Vav is larger than the threshold voltage Vth2 and smaller than the threshold voltage Vth3.

Figure 9:
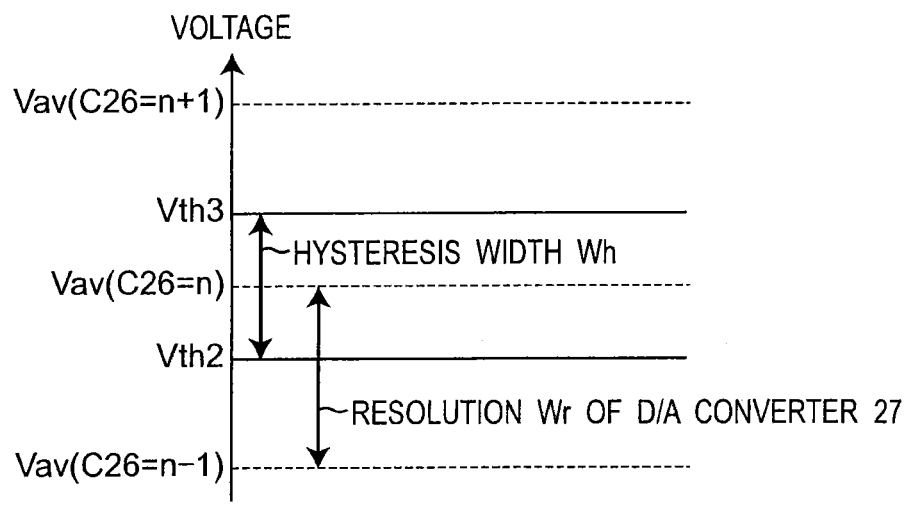
FIG. 9 is a graph showing one example of a relation between threshold voltages Vth2 and Vth3 and an average value signal Vav when a hysteresis width Wh of the hysteresis comparator 29 of FIG. 5 is smaller than a resolution Wr of a D/A converter 27.
Figure 10:
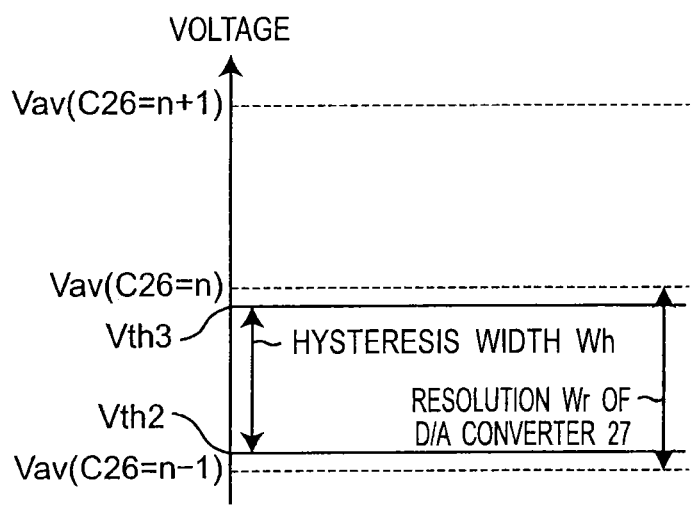
FIG. 10 is a graph showing one example of a relation between the threshold voltages Vth2 and Vth3 and the average value signal Vav when the hysteresis width Wh of the hysteresis comparator 29 of FIG. 5 is smaller than the resolution Wr of the D/A converter 27.
Figure 11:
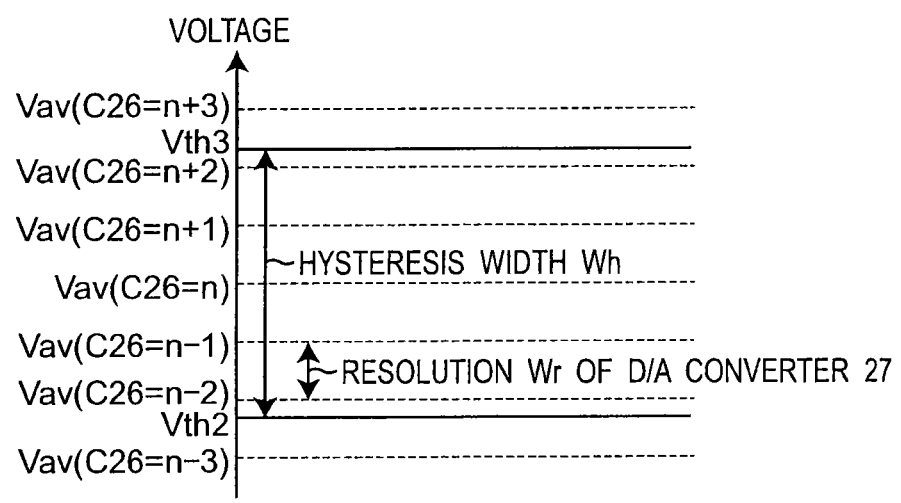
FIG. 11 is a graph showing one example of a relation between the threshold voltages Vth2 and Vth3 and the average value signal Vav when the hysteresis width Wh of the hysteresis comparator 29 of FIG. 5 is larger than the resolution Wr of the D/A converter 27.

Next, a setting method of the hysteresis width Wh of the hysteresis comparator 29 is described with reference to FIGS. 9 to 11. FIGS. 9 and 10 are graphs showing one example and another example of a relation between the threshold voltages Vth2 and Vth3 and the average value signal Vav when the hysteresis width Wh of the hysteresis comparator 29 of FIG. 5 is smaller than the resolution Wr of the D/A converter 27. FIG. 11 is a graph showing one example of a relation between the threshold voltages Vth2 and Vth3 and the average value signal Vav when the hysteresis width Wh of the hysteresis comparator 29 of FIG. 5 is larger than the resolution Wr of the D/A converter 27. FIGS. 9 to 11 show the voltage level of the average value signal Vav when the counted value C26 of the counter circuit 26 is n−3, n−2, . . . , n+3. In the example shown in FIG. 9, the voltage level of the average value signal Vav becomes a value between the threshold voltages Vth2 and Vth3 when the counted value C26 is n, and therefore, the offset signal generator circuit 3A shifts to the third operation mode to stop the count operation. However, when the hysteresis width Wh of the hysteresis comparator 29 is set to a value smaller than the resolution Wr of the D/A converter 27, it is sometimes a case where the voltage level of the average value signal Vav does not become a voltage level between the threshold voltages Vth2 and Vth3 as shown in FIG. 10. In this case, the voltage level of the average value signal Vav is larger than the threshold voltage Vth3 when the counted value C26 is n, and therefore, the offset signal generator circuit 3A shifts to the second operation mode to decrement the counted value C26 to n−1. As a result, the voltage level of the average value signal Vav becomes smaller than the threshold voltage Vth2 at the next count timing, and the offset signal generator circuit 3A shifts to the first operation mode to increment the counted value C26 to n. The counter circuit 26 subsequently repeats the increment and decrement of the counted value C26.

On the other hand, as shown in FIG. 11, in a case where the voltage level of the average value signal Vav is larger than the threshold voltage Vth3 when the hysteresis width Wh of the hysteresis comparator 29 is set to a value larger than the resolution Wr of the D/A converter 27, the counter circuit 26 decrements the counted value C26. Then, the voltage level of the average value signal Vav becomes the value of the threshold voltages Vth2 and Vth3 when the counted value C26 becomes n+2, and therefore, the counter circuit 26 stops the count operation. In a case where the voltage level of the average value signal Vav is smaller than the threshold voltage Vth2, the counter circuit 26 increments the counted value C26. Then, the voltage level of the average value signal Vav becomes the value of the threshold voltages Vth2 and Vth3 when the counted value C26 becomes n−2, and therefore, the counter circuit 26 stops the count operation. Therefore, by setting the hysteresis width Wh to a value larger than the resolution Wr of the D/A converter 27, the fluctuations in the counted value C26 can be suppressed to the minimum, and the count operation in the counter circuit 26 can be stopped in the normal operation during which the voltage level of the average value signal Vav has the value between the threshold voltages Vth2 and Vth3.

Next, an operation of the rotation detector apparatus 10A is described next with reference to FIG. 12. FIG. 12 is a timing chart showing the operation of the rotation detector apparatus 10A of FIG. 5. Referring to FIG. 12, the timing generator circuit 90A generates the hold circuit reset signal S90h, the count timing signal S90c and the instruction clearing signal S90b based on the timings t0, t1 and t2 at the rising edges of the binarized signal Vbi. In addition, as shown in FIG. 12, the timing generator circuit 90A generates the comparison timing signal S90a-1 having the high-level at the timings t11 and t13 at which the threshold voltage Vtha is the threshold voltage Vth3. On the other hand, the timing generator circuit 90A generates the high-level comparison timing signal S90a-2 having the high-level at timings t12 and t14 at which the threshold voltage Vtha is the threshold voltage Vth2. Since the voltage level of the average value signal Vav is larger than the comparison voltage Vth3 at the timing t11, the down-count instruction signal S25da having the high-level is generated. In response to this, the counter circuit 26 decrements the counted value C26 by one from n to n−1 at the timing t1, and outputs the counted value C2 to the D/A converter 27. As a result, the voltage level of the offset signal Voff is lowered, and the voltage level of the offset correction signal Vadj is also lowered. In addition, since the voltage level of the average value signal Vav is smaller than the comparison voltage Vth3 at the timing t13 and the voltage level of the average value signal Vav is larger than the comparison voltage Vth2 at the timing t14, the respective voltage levels of the up-count instruction signal S25ua and the down-count instruction signal S25da are low-level. Therefore, the counted value C26 is neither incremented nor decremented at the timing t2, and the voltage level of the offset signal Voff is maintained.

As described above, according to the present embodiment, the voltage level of the offset signal Voff is changed so that the voltage level of the average value signal Vav generated based on the offset correction signal Vadj becomes larger than the threshold voltage Vth2 and smaller than the threshold voltage Vth3. Therefore, it is possible to binarize the rotation detection signal Vde, which does not include digital data, to generate the binarized signal Vbi with accurately higher than that of the prior art. In addition, even when the voltage level of the rotation detection signal Vde fluctuates due to changes in the environmental temperature, it is always possible to generate the binarized signal Vbi having the duty ratio of 50% with reliably higher than that of the prior art. In addition, at the timings (e.g., the timings t0, t1 and t2 of FIG. 12) at which the offset signal Voff is changed, the signal voltage of the offset signal Voff changes by the predetermined voltage Wr corresponding to the resolution of the D/A converter 27 regardless of the magnitude of a difference between the average value signal Vav and the threshold voltages Vth2 and Vth3. Therefore, even when a noise of a large amplitude such as a spike noise having a relatively small time cycle is superimposed on the rotation detection signal Vde, the signal voltage of the offset signal Voff changes only by the predetermined variation Wr that is smaller than the amplitude of the spike noise, and therefore, it is possible to generate the binarized signal Vbi with reliably higher than that of the prior art.

Further, according to the present embodiment, since the threshold voltage Vtha of the hysteresis comparator 29 is outputted to the comparator circuit 25A, the comparison level generator circuits 41 and 42 need not be provided as compared with the first embodiment, and this leads to a reduced circuit size. In addition, one comparator can be reduced as compared with the comparator circuit 25 of the first embodiment.

The timing generator circuit 90A generates the signals S90h, S90b and S90c with the time cycle three times the time cycle of the binarized signal Vbi, however, the present invention is not limited to this. The timing generator circuit 90A may generate the signals S90h, S90b and S90c with a time cycle two or more times the time cycle of the binarized signal Vbi. In addition, in the present embodiment, the timing generator circuit 90A detects each rising edge of the binarized signal Vbi outputted from the comparator 28, and generates the hold circuit reset signal S90h and the count timing signal S90c, each if which has the pulse shape of the pulse width Δt and rises at the timing of the rising edge of the clock signal CK immediately after the rise of the binarized signal Vbi, every time cycle three times the time cycle of the binarized signal Vbi, where the time cycle of the binarized signal Vbi is assumed to be the timing interval between rising edges. However, the present invention is not limited to this. The timing generator circuit 90A may generate the hold circuit reset signal S90h and the count timing signal S90c at, for example, a predetermined timing within one time cycle of the binarized signal Vbi after the rise of the binarized signal Vbi.

Third Embodiment

When the hysteresis width Wh is set to a value larger than the resolution Wr of the D/A converter 27 as shown in FIG. 11, in the rotation detector apparatus 10A of the second embodiment, the value of the counted value C26 when the counter circuit 26 stops the count operation as a consequence that the voltage level of the average value signal Vav becomes a value between the threshold voltage Vth2 and the threshold voltage Vth3 changes depending on the relation between the voltage level of the average value signal Vav and the threshold voltages Vth2 and Vth3 during the activation. Concretely speaking, referring to FIG. 11, when the voltage level of the average value signal Vav during the activation is smaller than the threshold voltage Vth2, the counter circuit 26 increments the counted value C26 until the value becomes n−2, and thereafter, stops the count operation. When the voltage level of the average value signal Vav during the activation is larger than the threshold voltage Vth3, the counter circuit 26 decrements the counted value C26 until the value becomes n+2, and thereafter, stops the count operation.

Figure 13:
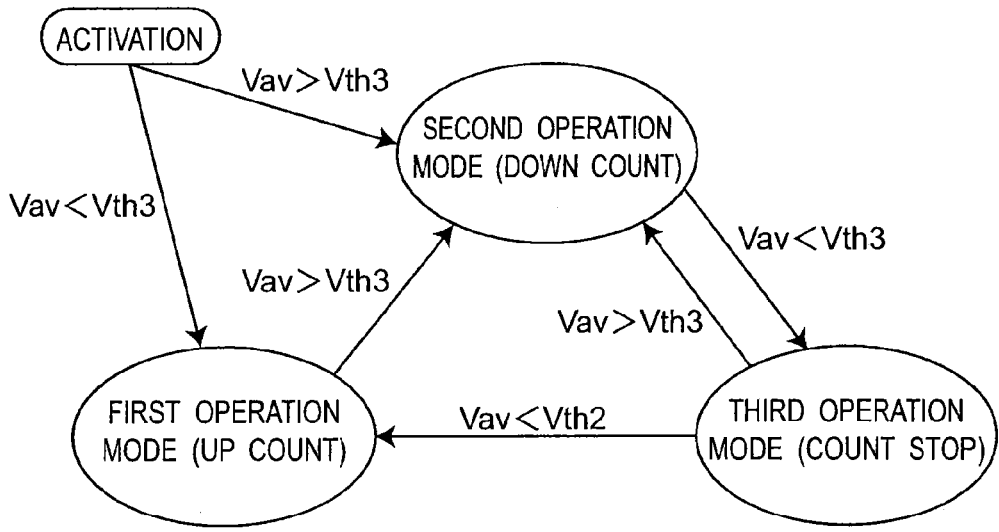
FIG. 13 is a state transition diagram showing an operation of an offset signal generator circuit 3A in a third embodiment of the present invention.

In the present embodiment, the operation of the counter circuit 26 is controlled so that the voltage level of the average value signal Vav becomes one predetermined value in the normal operation during which the voltage level of the average value signal Vav has a value between the threshold voltages Vth2 and Vth3. FIG. 13 is a state transition diagram showing an operation of the offset signal generator circuit 3A in the third embodiment of the present invention. In the present embodiment, the timing generator circuit 90A and the comparator circuit 25A are configured so that the offset signal generator circuit 3A operates according to the state transition diagram of FIG. 13.

Referring to FIG. 13, the offset signal generator circuit 3A shifts to the second operation mode in which the down-count operation is executed when the voltage level of the average value signal Vav is larger than the threshold voltage Vth3 during the activation of the rotation detector apparatus 10A, to decrement the counted value C26 until the voltage level of the average value signal Vav becomes smaller than the threshold voltage Vth3. Then, the offset signal generator circuit 3A shifts to the third operation mode in which the count operation is stopped when the voltage level of the average value signal Vav becomes smaller than the threshold voltage Vth3 in the second operation mode. When the voltage level of the average value signal Vav is smaller than the threshold voltage Vth3 during the activation of the rotation detector apparatus 10A, the offset signal generator circuit 3A shifts to the first operation mode in which the up-count operation is executed, to up-count the counted value C26 until the voltage level of the average value signal Vav becomes larger than the threshold voltage Vth3. Then, the offset signal generator circuit 3A shifts to the second operation mode when the voltage level of the average value signal Vav becomes larger than the threshold voltage Vth3. Next, the offset signal generator circuit 3A decrements the counted value C26 until the voltage level of the average value signal Vav becomes smaller than the threshold voltage Vth3. Then, the offset signal generator circuit 3A shifts to the third operation mode in which the count operation is stopped when the voltage level of the average value signal Vav becomes smaller than the threshold voltage Vth3 in the second operation mode.

In addition, when the voltage level of the average value signal Vav becomes larger than the threshold voltage Vth3 due to a fluctuation in the voltage level of the rotation detection signal Vde attributed to a temperature change or the like in the third operation mode in FIG. 13, the offset signal generator circuit 3A shifts to the second operation mode to decrement the counted value C26 until the voltage level of the average value signal Vav becomes smaller than the threshold voltage Vth3. When the voltage level of the average value signal Vav becomes smaller than the threshold voltage Vth2 in the third operation mode, the offset signal generator circuit 3A shifts to the first operation mode to increment the counted value C26 until the voltage level of the average value signal Vav becomes larger than the threshold voltage Vth3, and subsequently shifts to the second operation mode to decrement the counted value C26 until the voltage level of the average value signal Vav becomes smaller than the threshold voltage Vth3.

By controlling the operation of the counter circuit 26 as described above, when the hysteresis width Wh is set to a value larger than the resolution Wr of the D/A converter as shown in FIG. 11, the count operation of counter circuit 26 can be stopped at a predetermined voltage level that is lower than the threshold voltage Vth3 by the resolution Wr of the D/A converter 27 at the maximum, regardless of whether or not the voltage level of the average value signal Vav is larger than the threshold voltage Vth3 during the activation. For example, in the example of FIG. 11, the counter circuit 26 stops the count operation when the counted value C26 becomes n+2.

Modified Embodiment of Third Embodiment

Figure 14:
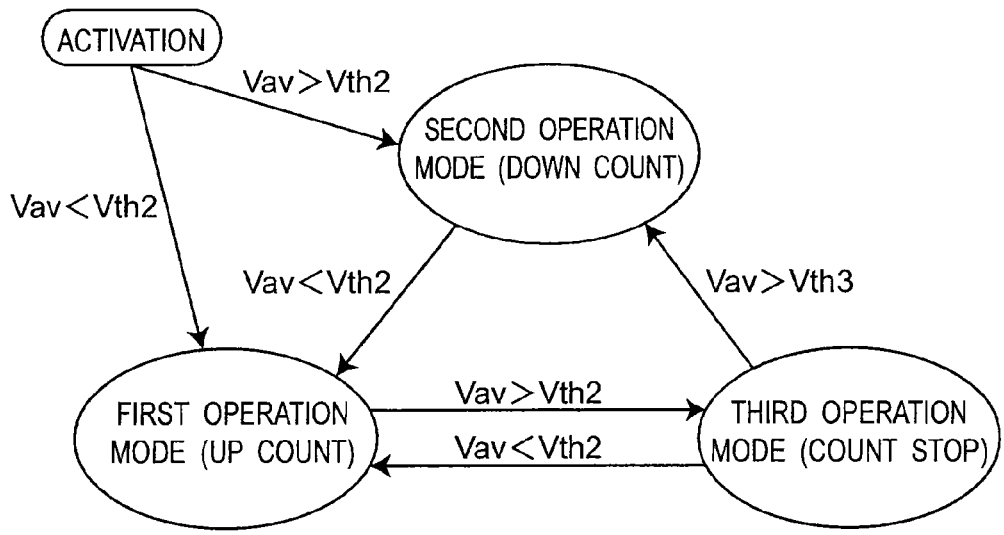
FIG. 14 is a state transition diagram showing an operation of the offset signal generator circuit 3A in a modified embodiment of the third embodiment of the present invention.

FIG. 14 is a state transition diagram showing an operation of the offset signal generator circuit 3A in a modified embodiment of the third embodiment of the present invention. In the present modified embodiment, the counted value C26 when the voltage level of the average value signal Vav becomes a value between the threshold voltages Vth2 and Vth3 and the counter circuit 26 stops the count operation is different from that of the third embodiment. In the present modified embodiment, the timing generator circuit 90A and the comparator circuit 25A are configured so that the offset signal generator circuit 3A operates according to the state transition diagram of FIG. 14.

Referring to FIG. 14, when the voltage level of the average value signal Vav is larger than the threshold voltage Vth2 during the activation of the rotation detector apparatus 10A, the offset signal generator circuit 3A shifts to the second operation mode to execute the down-count operation to decrement the counted value C26 until the voltage level of the average value signal Vav becomes smaller than the threshold voltage Vth2. Then, the offset signal generator circuit 3A shifts to the first operation mode when the voltage level of the average value signal Vav becomes smaller than the threshold voltage Vth2 in the second operation mode. Next, the offset signal generator circuit 3A up-counts the counted value C26 until the voltage level of the average value signal Vav becomes larger than the threshold voltage Vth2. Then, the offset signal generator circuit 3A shifts to the third operation mode when the voltage level of the average value signal Vav becomes larger than the threshold voltage Vth2. When the voltage level of the average value signal Vav is smaller than the threshold voltage Vth2 during the activation of the rotation detector apparatus 10A, the offset signal generator circuit 3A shifts to the first operation mode for up-counting the counted value C26 to up-count the counted value C26 until the voltage level of the average value signal Vav becomes larger than the threshold voltage Vth2. Then, the offset signal generator circuit 3A shifts to the third operation mode when the voltage level of the average value signal Vav becomes larger than the threshold voltage Vth2.

In addition, in FIG. 14, the offset signal generator circuit 3A makes a transition to the second operation mode when the voltage level of the average value signal Vav becomes larger than the threshold voltage Vth3 due to fluctuations in the voltage level of the rotation detection signal Vde attributed to temperature changes or the like in the third operation mode, decrements the counted value C26 until the voltage level of the average value signal Vav becomes smaller than the threshold voltage Vth2, and subsequently shifts to the first operation mode to increment the counted value C26 until the voltage level of the average value signal Vav becomes larger than the threshold voltage Vth2. When the voltage level of the average value signal Vav becomes smaller than the threshold voltage Vth2 in the third operation mode, the offset signal generator circuit 3A shifts to the first operation mode to increment the counted value C26 until the voltage level of the average value signal Vav becomes larger than the threshold voltage Vth2, and returns to the third operation mode.

By controlling the operation of the counter circuit 26 as described above, when the hysteresis width Wh is set to a value larger than the resolution Wr of the D/A converter as shown in FIG. 11, the count operation of counter circuit 26 can be stopped at the predetermined voltage level that is higher than the threshold voltage Vth2 by the resolution Wr of the D/A converter 27 at the maximum, regardless of whether or not the voltage level of the average value signal Vav is larger than the threshold voltage Vth2 during the activation. For example, in the example of FIG. 11, the counter circuit 26 stops the count operation when the counted value C26 becomes n−2.

Fourth Embodiment

Figure 15:
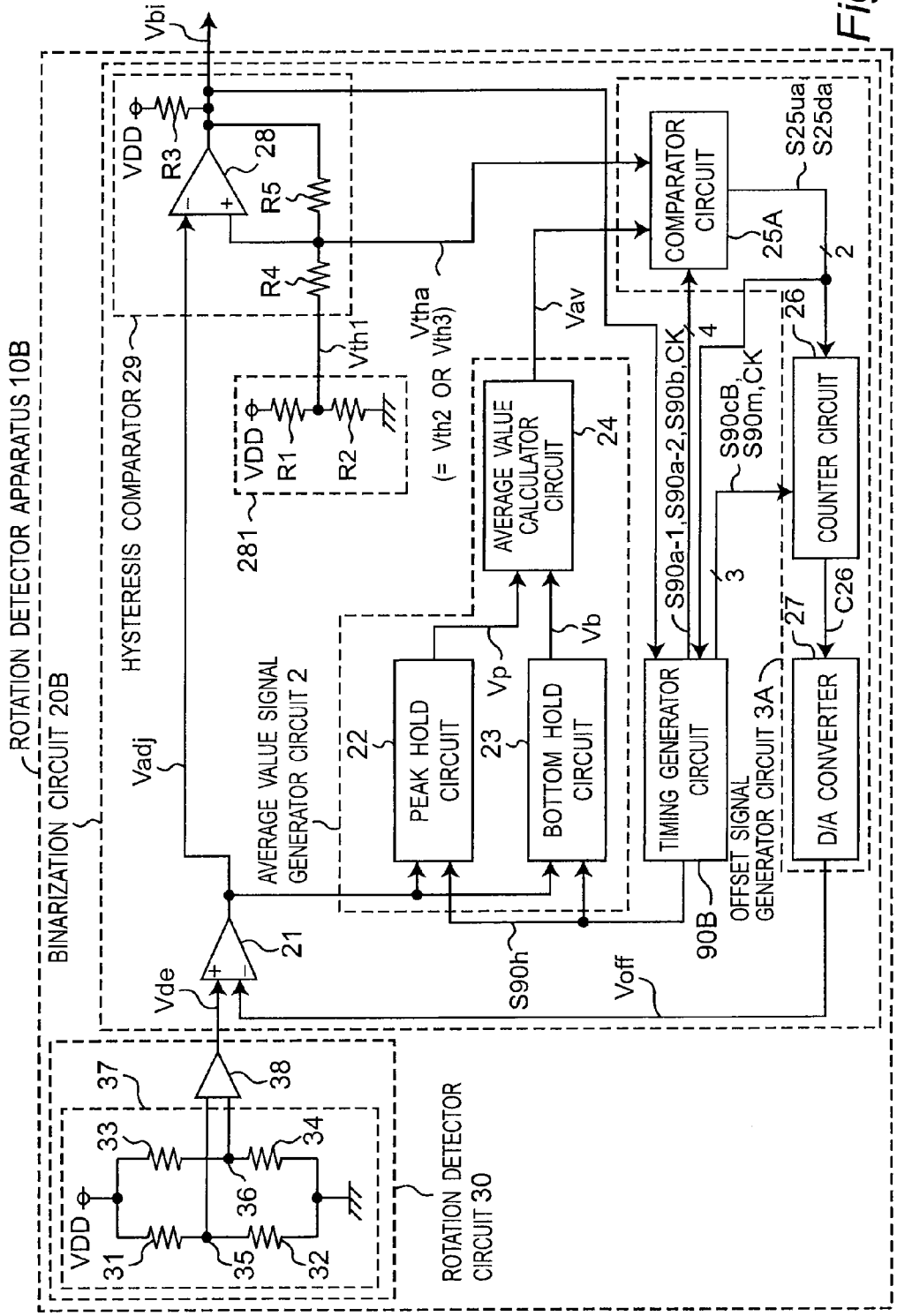
FIG. 15 is block diagram showing a configuration of a rotation detector apparatus 10B according to a fourth embodiment of the present invention.
Figure 16:
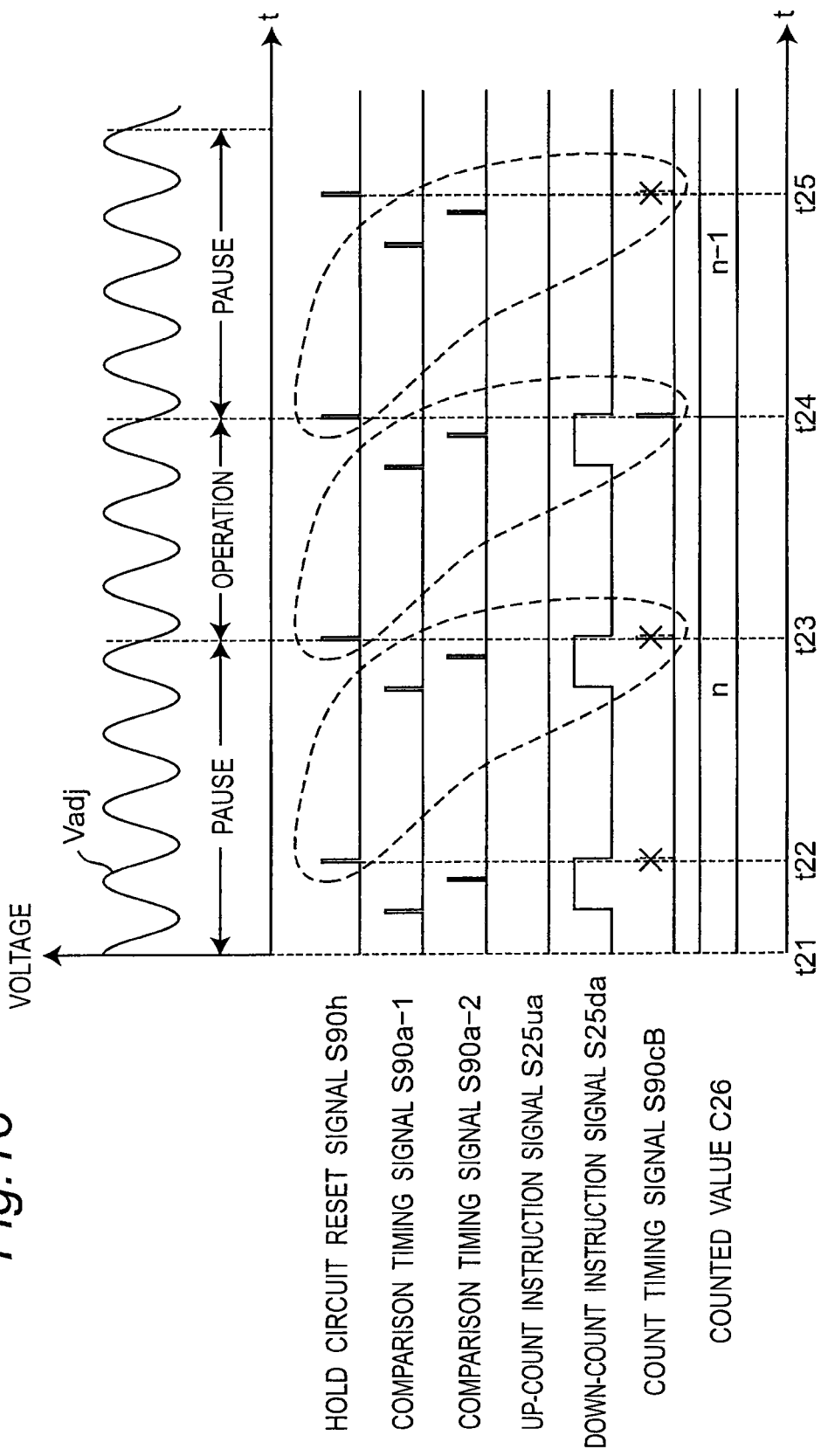
FIG. 16 is a timing chart showing an operation of the rotation detector apparatus 10B of FIG. 15 during normal operation.
Figure 17:
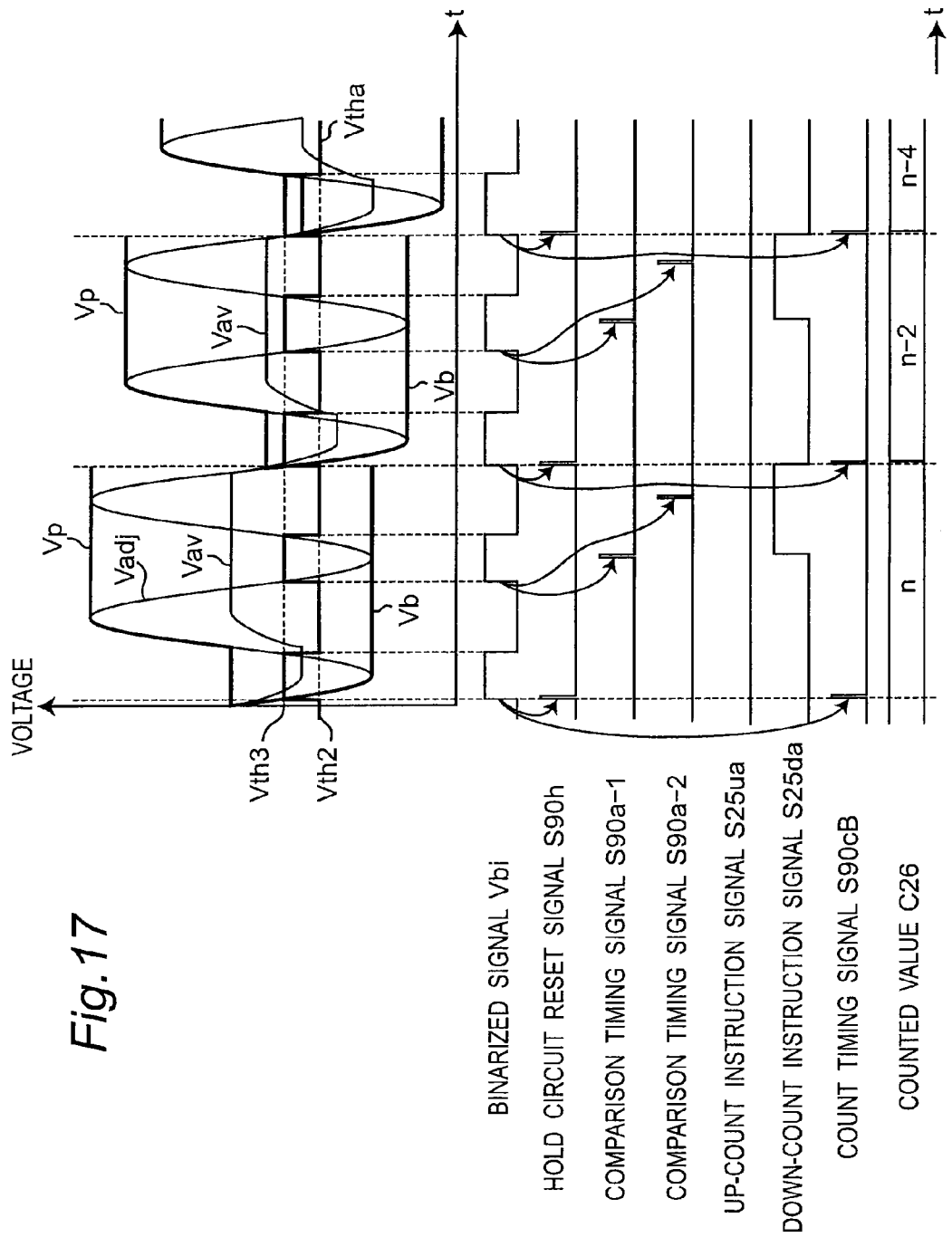
FIG. 17 is a timing chart showing an operation of the rotation detector apparatus 10B of FIG. 15 during activation.

FIG. 15 is a block diagram showing a configuration of a rotation detector apparatus 10B according to the fourth embodiment of the present invention. In addition, FIG. 16 is a timing chart showing an operation of the rotation detector apparatus 10B of FIG. 15 during normal operation, and FIG. 17 is a timing chart showing an operation of the rotation detector apparatus 10B of FIG. 15 during activation. The rotation detector apparatus 10B of the present embodiment includes a binarization circuit 20B instead of the binarization circuit 20A as compared with the rotation detector apparatus 10A of the second embodiment. In this case, the binarization circuit 20B is characterized by including a timing generator circuit 90B instead of the timing generator circuit 90A as compared with the binarization circuit 20A.

Referring to FIG. 15, the timing generator circuit 90B is a control circuit that controls the operations of the peak hold circuit 22, the bottom hold circuit 23, the comparator circuit 25 and the counter circuit 26, generates a hold circuit reset signal S90h in a manner similar to that of the timing generator circuit 90A, and outputs the hold circuit reset signal S90h to the peak hold circuit 22 and the bottom hold circuit 23. Further, the timing generator circuit 90B generates comparison timing signals S90a-1 and S90a-2, an instruction clearing signal S90b and a clock signal CK in a manner similar to that of the timing generator circuit 90A, and outputs the comparison timing signals S90a-1 and S90a-2, the instruction clearing signal S90b and the clock signal CK to the comparator circuit 25A. In addition, the timing generator circuit 90B outputs the clock signal CK to the counter circuit 26 in a manner similar to that of the timing generator circuit 90A. Further, the timing generator circuit 90B generates a count timing signal S90cB and a counter variation instruction signal S90m as follows during the normal operation and during the activation, and outputs the count timing signal S90cB and the counter variation instruction signal S90m to the counter circuit 26.

(1) During Normal Operation

Referring to FIGS. 15 and 16, the timing generator circuit 90B judges whether or not the voltage level of the average value signal Vav has a value between the threshold voltages Vth2 and Vth3 based on the up-count instruction signal S25ua and the down-count instruction signal S25da outputted from the comparator circuit 25A. During the normal operation when the voltage level of the average value signal Vav has a value between the threshold voltages Vth2 and Vth3, the timing generator circuit 90B operates so as to alternately repeat a pause period having a predetermined pause duration and an operation period having a predetermined operation duration as shown in FIG. 16. When the timing generator circuit 90B generates the hold circuit reset signal S90h having the high-level in the pause period, the timing generator circuit 90B does not generate the count timing signal S90cB having the high-level at the timing of generating a next hold circuit reset signal S90h. In addition, when the timing generator circuit 90B generates the high-level hold circuit reset signal S90h having the high-level in the operation period, the timing generator circuit 90B generates the count timing signal S90cB having the high-level at the timing of generating the next hold circuit reset signal S90h, and outputs the same signal to the counter circuit 26. Further, the timing generator circuit 90B generates the counter variation instruction signal S90m having the low-level, and outputs the same signal to the counter circuit 26. The counter circuit 26 detects the voltage levels of the up-count instruction signal S25ua and the down-count instruction signal S25da in response to the high-level count timing signal S90cB and the low-level counter variation instruction signal S90m. Then, the counter circuit 26 increments the counted value C26 by one in response to the up-count instruction signal S25ua having the high-level, at the timing of the rising edge of the clock signal CK. On the other hand, counter circuit 26 decrements the counted value C26 by one in response to the down-count instruction signal S25da having the low-level. The counter circuit 26 outputs the counted value C26 to the D/A converter 27. For example, referring to FIG. 16, the count timing signal S90cB having the high-level is not generated at the timings t23 and t25 subsequent to the hold circuit reset signal S90h having the high-level and generated at the timings t22 and t24 in the pause period. The count timing signal S90cB having the high-level is generated at the timing t24 subsequent to the high-level hold circuit reset signal S90h generated at the timing t23 in the pause period, and the counted value C26 is decremented by one.

Generally speaking, when the voltage level of the average value signal Vav becomes a value between the threshold voltages Vth2 and Vth3, fluctuations in the voltage level caused by temperature changes having a fluctuation time cycle longer than the time cycle of the binarized signal Vbi are superimposed on the voltage level of the average value signal Vav in the normal operation. According to the present embodiment, since the pause periods are provided during the normal operation, it is possible to suppress the frequency of the count operation of the counter circuit 26 to the minimum, and it is possible to suppress the change in the voltage level of the offset signal Voff in the offset signal generator circuit 3A to the minimum.

(2) During Activation

Referring to FIGS. 15 and 17, when the offset signal generator circuit 3A is executing the count operation in the first operation mode or the second operation mode (See FIG. 8) immediately after the activation of the rotation detector apparatus 10B, the timing generator circuit 90B generates the hold circuit reset signal S90h having the high-level, the comparison timing signals S90a-1 and S90a-2 each having the high-level, the count timing signal S90cB having the high-level and the instruction clearing signal S90b having the high-level with a time cycle that is two times the time cycle of the binarized signal Vbi in a manner similar to that of the generator circuit 90A of the second embodiment. Further, when the offset signal generator circuit 3A is executing the count operation in the first operation mode or the second operation mode immediately after the activation of the rotation detector apparatus 10B, the timing generator circuit 90B generates the counter variation instruction signal S90m having the high-level to instruct setting of variation in the counted value C26 to two when the counted value C26 is incremented or decremented by one, and outputs the same signal to the counter circuit 26. The counter circuit 26 detects the voltage levels of the up-count instruction signal S25ua and the down-count instruction signal S25da in response to the count timing signal S90cB having the high-level and the counter variation instruction signal S90m having the high-level. Then, the counter circuit 26 increments the counted value C26 by two in response to the up-count instruction signal S25ua having the high-level, at the timing of the rising edge of the clock signal CK. On the other hand, the counter circuit 26 decrements the counted value C26 by two in response to the down-count instruction signal S25da having the high-level. The counter circuit 26 outputs the counted value C26 to the D/A converter 27.

Generally speaking, it is sometimes the case where the voltage level of the average value signal Vav is very smaller than the threshold voltage Vth2 or very larger than the threshold voltage Vth3 during the activation of the rotation detector apparatus 10B and the binarization circuit 20B. Therefore, it is required to change the voltage level of the offset signal Voff in a shorter period of time than in the normal operation. According to the present embodiment, the generating timing intervals of the signals S90h, S90a-1, S90a-2, S90b and S90cB during the activation are set shorter than the generating timing intervals of the signals S90h, S90a-1, S90a-2, S90b and S90cB during the normal operation. In addition, the amount of increment or decrement of the counted value C26 in the counter circuit 26 is set to two. With these settings, during the activation of the binarization circuit 20B, the timing generator circuit 90B controls the average value signal generator circuit 2 and the offset signal generator circuit 3A so as to generate the offset signal Voff at timing intervals shorter than the generating timing intervals of the offset signal Voff when the signal voltage of the average value signal Vav is larger than the threshold voltage Vth2 and smaller than the threshold voltage Vth3. Therefore, the voltage level of the average value signal Vav converges to a value between the threshold voltages Vth2 and Vth3 quickly during the activation as compared with the second embodiment.

In the present embodiment, the generating timing intervals of the signals S90h, S90a-1, S90a-2, S90b and S90cB during the activation are set shorter than those during the normal operation, and the amount of incrementing or decrementing the counted value C26 in the counter circuit 26 is set to two. However, the present invention is not limited to this. It is proper to execute at least one of the following:

(a) setting the generating timing intervals of the signals S90h, S90a-1, S90a-2, S90b and S90cB during the activation shorter than those during the normal operation; and (b) setting the amount of incrementing or decrementing the counted value C26 in the counter circuit 26 to a value larger than the amount of incrementing or decrementing the counted value C26 in the counter circuit 26 during the normal operation.

In addition, the timing generator circuit 90B may be configured to set the pulse width of the count timing signal S90c from the timing generator circuit 90B to a width (2 Δt) two times the pulse width of the count timing signal S90c during the normal operation, immediately after the activation, so as to increment or decrement the counted value C26 at the timing of the rising edges of the clock signal CK two times successively.

Modified Embodiment of Fourth Embodiment

Figure 18:
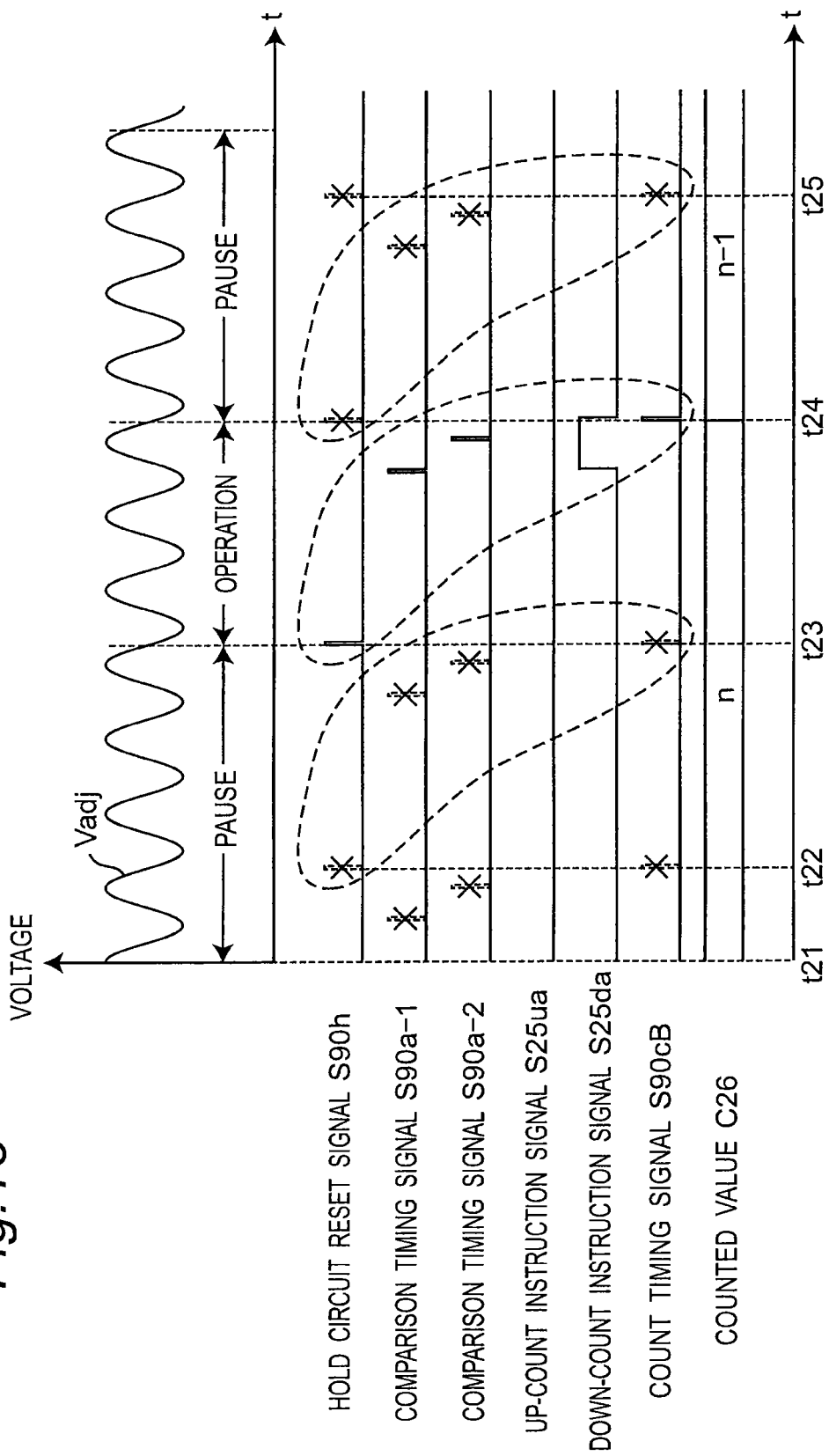
FIG. 18 is a timing chart showing an operation of a rotation detector apparatus 10B according to a modified embodiment of the fourth embodiment of the present invention during the normal operation.

FIG. 18 is a timing chart showing an operation of the rotation detector apparatus 10B according to a modified embodiment of the fourth embodiment of the present invention during the normal operation. The present modified embodiment is different from the fourth embodiment only in the operation of the timing generator circuit 90B during the normal operation. In the present modified embodiment, as shown in FIG. 18, the timing generator circuit 90B sets the pause period and the operation period in a manner similar to that of the fourth embodiment, and generates the hold circuit reset signal S90h having the high-level only in the operation period. Then, the timing generator circuit 90B generates the comparison timing signals S90a-1 and S90a2 each having the high-level, the count timing signal S25*da* having the high-level, and the instruction clearing signal S90*b* having the high-level subsequently to the hold circuit reset signal S90*h* having the high-level.

According to the present modified embodiment, since the pause periods are provided during the normal operation in a manner similar to that of the fourth embodiment, the frequency of the count operation of the counter circuit 26 is suppressed to the minimum, and the change in the voltage level of the offset signal Voff in the offset generator circuit 3A can be suppressed to the minimum.

Fifth Embodiment

Figure 19:
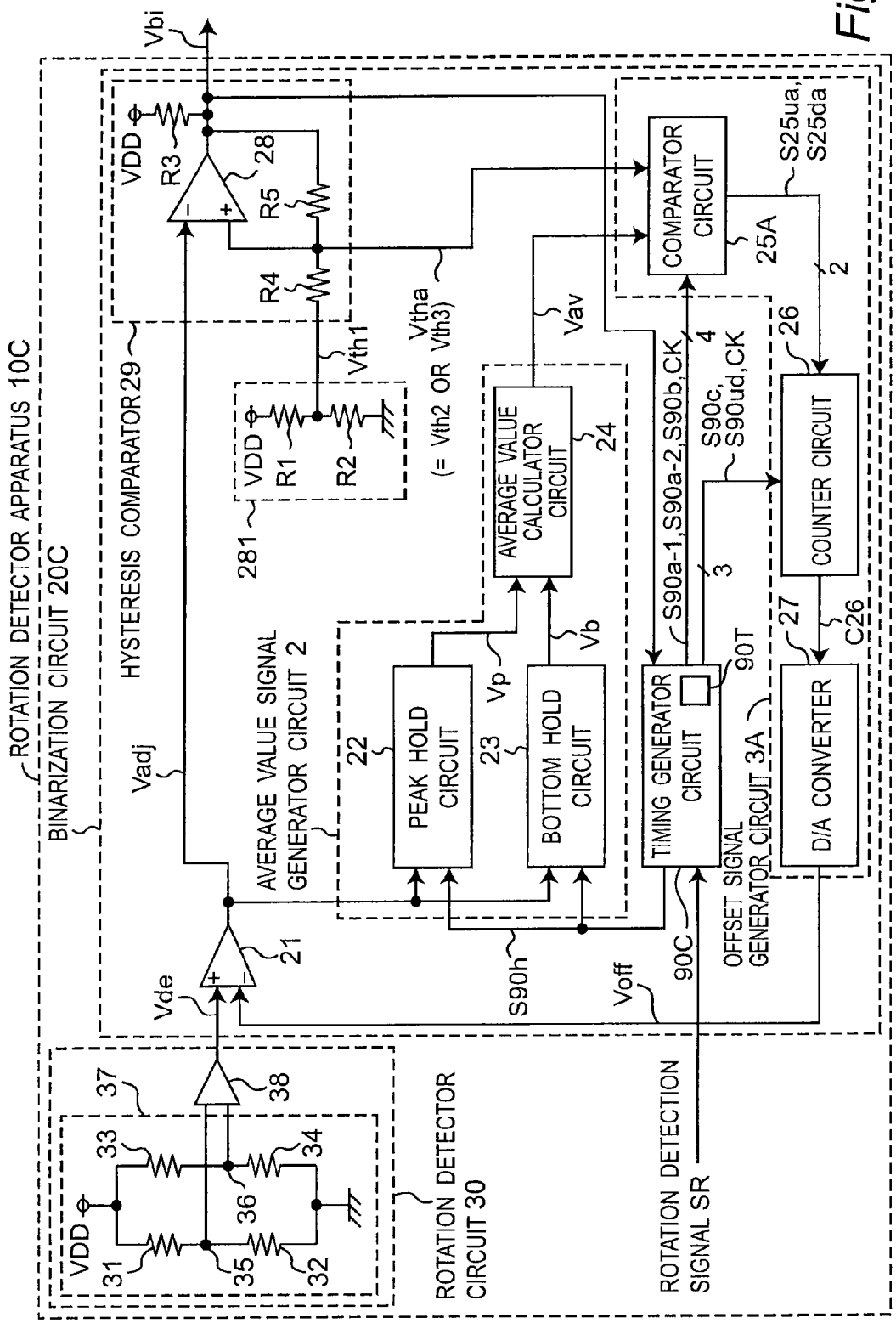
FIG. 19 is a block diagram showing a configuration of a rotation detector apparatus 10C according to a fifth embodiment of the present invention.
Figure 20:
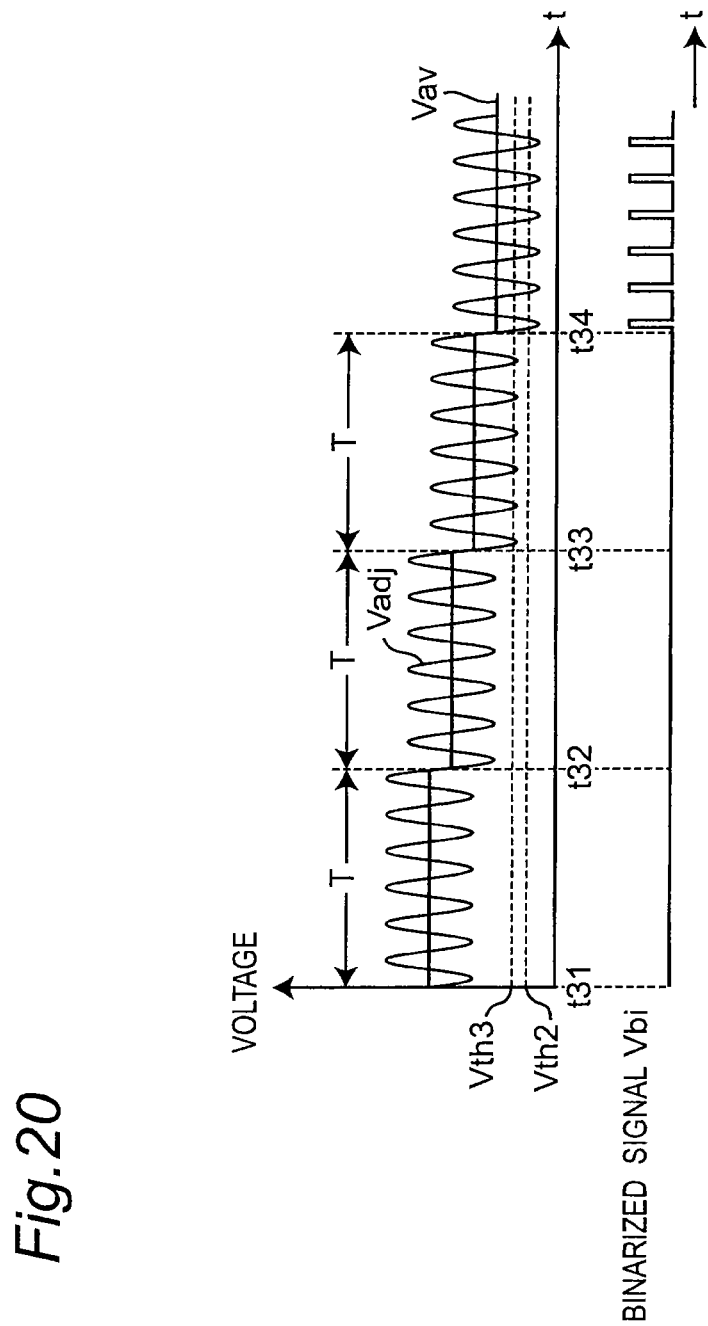
FIG. 20 is a timing chart showing the operation of the rotation detector apparatus 10C of FIG. 19.

FIG. 19 is a block diagram showing a configuration of a rotation detector apparatus 10C according to the fifth embodiment of the present invention, and FIG. 20 is a timing chart showing an operation of the rotation detector apparatus 10C of FIG. 19. The rotation detector apparatus 10C of the present embodiment includes a binarization circuit 20C instead of the binarization circuit 20A as compared with the rotation detector apparatus 10A of the second embodiment. In this case, as compared with the binarization circuit 20A, the binarization circuit 20C is characterized by including a timing generator circuit 90C which includes a timer circuit 90T for measuring a predetermined timer duration T instead of the timing generator circuit 90A.

Referring to FIG. 19, the timing generator circuit 90C is a control circuit that controls the operations of the peak hold circuit 22, the bottom hold circuit 23, the comparator circuit 25 and the counter circuit 26, and generates the signals S90*h*, S90*a*-1, S90*a*-2, S90*b*, S90*c* and CK in a manner similar to that of the timing generator circuit 90A. Further, the timing generator circuit 90C receives a rotation detection signal SR representing whether or not athe rotating body 50 is rotating from an external apparatus of the rotation detector apparatus 10C. Then, upon detecting that the voltage level of the binarized signal Vbi has not changed for the above-described timer duration T while receiving the rotation detection signal SR representing that the rotating body 50 is rotating, the timing generator circuit 90C operates the offset signal generator circuit 3A by generating a count instruction signal S90*ud* to instruct increment or decrement of the counted value C26 based on the voltage level of the binarized signal Vbi and by outputting the same signal to the counter circuit 26. In response to this, the counter circuit 26 increments or decrements the counted value C26. For example, at the timings t31, t32, t33 and t34 of FIG. 20, the timing generator circuit 90C detects the rotation detection signal SR representing that the rotating body 50 is rotating and detects that the voltage level of the binarized signal Vbi has remained low-level for timer duration T, generates the count instruction signal S90*ud* instructing decrement of the counted value C26, and outputs the count instruction signal S90*ud* to the counter circuit 26.

For example, when the minimum value of the offset correction signal Vadj is larger than the threshold voltage Vth3 or the maximum value of the offset correction signal Vadj is smaller than the threshold voltage Vth2 during the activation of the rotation detector apparatus 10A or the like in the second embodiment, the timing generator circuit 90A cannot generate the signals S90*h*, S90*a*-1, S90*a*-2, S90*b* and S90*c* based on the binarized signal Vbi. Therefore, there is such a problem that the offset correction signal Vadj cannot be binarized. In the present embodiment, the voltage level of the offset signal Voff is adjusted so that the offset correction signal Vadj can be binarized by operating the counter circuit 26 also when the minimum value of the offset correction signal Vadj is larger than the threshold voltage Vth3 or when the maximum value of the offset correction signal Vadj is smaller than the threshold voltage Vth2. Therefore, it is possible to generate the binarized signal Vbi with accuracy higher than that of the second embodiment.

In the second to fifth embodiments and their modified embodiments, the threshold value generator circuit 281 is provided in the binarization circuits 20A, 20B and 20C, however, the present invention is not limited to this, and the threshold value generator circuit 281 may be provided outside the binarization circuits 20A, 20B and 20C.

In addition, in the first embodiment, the timing generator circuit 90 may control the average value signal generator circuit 2 and the offset signal generator circuit 3 so as to generate the offset signal Voff with generating timing intervals shorter than the generating timing interval of the offset signal Voff when the signal voltage of the average value signal Vav is larger than the threshold voltage Vc1 and smaller than the threshold voltage Vc2, during the activation of the binarization circuit 20. In addition, the timing generator circuit 90 may receive the rotation detection signal SR representing whether or not the gear 50 is rotating, and operate the offset signal generator circuit 3 when the timing generator circuit 90 detects that the gear 50 is rotating and the voltage level of the binarized signal Vbi has not changed for a predetermined time period, based on the rotation detection signal SR and the binarized signal Vbi.

Sixth Embodiment

Figure 21:
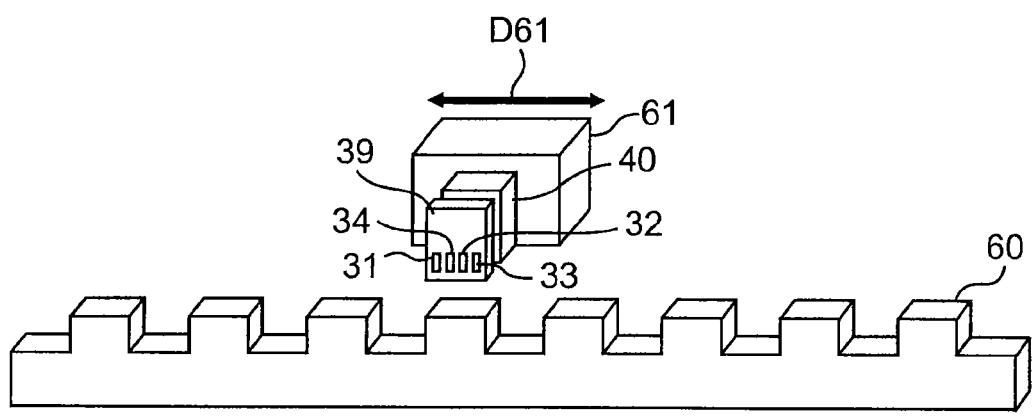
FIG. 21 is a perspective view showing a magneto-resistive effect element unit 39, a magnet 40 and a fixed rail 60 of a movement detector apparatus according to a sixth embodiment of the present invention.

FIG. 21 is a perspective view showing a magneto-resistive effect element unit 39, a magnet 40 and a fixed rail 60 of a movement detector apparatus according to the sixth embodiment of the present invention. The movement detector apparatus of the present embodiment is different from the rotation detector apparatuses 10, 10A, 10B and 10C of the above-described first to fifth embodiments only in the setting up method of the magneto-resistive effect element unit 39 and the magnet 40. In the rotation detector apparatuses 10, 10A, 10B and 10C of the above-described first to fifth embodiments, the magneto-resistive effect element unit 39 and the magnet 40 are made to face the gear 50 as shown in FIG. 1. Then, the rotation detection signal Vde representing the rotation of the gear 50 is generated by the rotation detector circuit 30 of FIG. 2 and outputted. On the other hand, in the present embodiment, the magneto-resistive effect element unit 39 and the magnet 40 are attached to a moving body 61 and made to face the fixed rail 60 in as shown in FIG. 21. In this case, protruding portions and recess portions are linearly formed alternately and repetitively on the rail 60 made of a magnetic material, and the moving body 61 moves in a moving direction D61 parallel to the longitudinal direction of the rail 60. The magnet 40 is arranges sp as to face the rail 60 with a predetermined spacing between the magnet 40 and the rail 60, generates a bias magnetic field, and applies the bias magnetic field to the magneto-resistive effect element unit 39. The magneto-resistive effect element unit 39 is arranged so as to face the rail 60 with a predetermined spacing between the magneto-resistive effect element unit 39 and the magnet 40, and a predetermined spacing between the magneto-resistive effect element unit 39 and the rail 60. The magneto-resistive effect elements 31, 32, 33 and 34 are arranged on the surface of the magneto-resistive effect element unit 39 along the moving direction D61 of the moving body 61, with a predetermined spacing.

When the moving body 61 moves in the moving direction D61, the protruding portions and the recess portions of the rail 60 alternately face the magneto-resistive effect element unit 39. Therefore, the bias magnetic field applied from the magnet 40 to the magneto-resistive effect element unit 39 changes, and the resistance values of the respective magneto-resistive effect elements 31, 32, 33 and 34 change in response to this. Then, the rotation detector circuit 30 of FIG. 2 operates as movement detection means for detecting the movement amount and the movement speed of the moving body 61, and generates a movement detection signal, which is similar to the rotation detection signal Vde representing the rotation of the gear 50 and represents the movement amount and the movement speed of the moving body 61. Namely, the frequency of the sinusoidal signal component included in the movement detection signal corresponds to the movement speed of the moving body 61, and the number of peaks (or bottoms) of the sinusoidal signal component from a predetermined timing corresponds to the movement amount of the moving body 61 from the timing.

Therefore, according to the rotation detector apparatus of the present embodiment, it is possible to generate the binarized signal Vbi based on the movement detection signal representing the movement amount and the movement speed of the moving body 61 from the rotation detector apparatus 30 of FIG. 2 in a manner similar to that of the rotation detector apparatuses 10, 10A, 10B and 10C of the first to fifth embodiments. Then, it is possible to detect the position and the movement speed of the moving body 61 can be detected by counting the binarized signal Vbi. The present embodiment exhibits actions and advantageous effects similar to those of the first to fifth embodiments.

Seventh Embodiment

Figure 22:
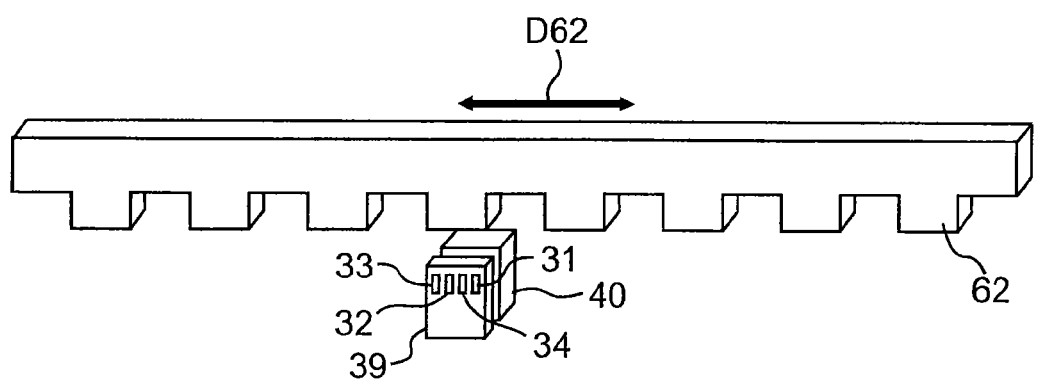
FIG. 22 is a perspective view showing a magneto-resistive effect element unit 39, a magnet 40 and a moving rail 62 of a movement detector apparatus according to a seventh embodiment of the present invention.

FIG. 22 is a perspective view showing a magneto-resistive effect element unit 39, a magnet 40 and a moving rail 62 of a movement detector apparatus according to the seventh embodiment of the present invention. The present embodiment is different from the sixth embodiment only in the setting up method of the magneto-resistive effect element unit 39 and the magnet 40. Referring to FIG. 22, the rail 62 configured in a manner similar to that of the rail 60 of FIG. 21 moves in a moving direction D62 parallel to the longitudinal direction thereof. In addition, the magneto-resistive effect element unit 39 and the magnet 40 are fixed. As shown in FIG. 22, when the rail 62 moves in the moving direction D62 with respect to the magneto-resistive effect element unit 39 and the magnet 40, the protruding portions and the recess portions of the rail 62 alternately face the magneto-resistive effect element unit 39. Therefore, the bias magnetic field applied from the magnet 40 to the magneto-resistive effect element unit 39 changes, and the resistance values of the respective magneto-resistive effect elements 31, 32, 33 and 34 change in response to this. Then, the rotation detector circuit 30 of FIG. 2 operates as movement detection means for detecting the movement speed and the movement amount of the rail 62, and generates a movement detection signal which represents the movement of the rail 62 and is similar to the rotation detection signal Vde representing the rotation of the gear 50.

Therefore, according to the rotation detector apparatus of the present embodiment, it is possible to generate the binarized signal Vbi based on the movement detection signal representing the movement speed and the movement amount of the rail 62 from the rotation detector apparatus 30 of FIG. 2 in a manner similar to that of the rotation detector apparatuses 10, 10A, 10B and 10C of the first to fifth embodiments. Then, it is possible to detect the position and the movement speed of the rail 62 by counting the binarized signal Vbi. The present embodiment produces operative effects similar to those of the first to fifth embodiments.

When the binarization circuit 20C of FIG. 19 is used in the sixth and seventh embodiments, the timing generator circuit 90T receives an input of a movement detection signal representing whether or not the moving body 61 or the rail 62 is moving instead of the rotation detection signal SR representing whether or not the gear 50 is rotating.

INDUSTRIAL APPLICABILITY

As described above, each of the binarization circuit for processing the detection signal, the rotation detector apparatus and the movement detector apparatus of the present invention includes the offset signal generating means that compares the signal voltage of the average value signal with the predetermined second threshold value and the third threshold value larger than the second threshold value, and generates the offset signal so that the signal voltage of the average value signal has a voltage value between the second threshold voltage and the third threshold value. Therefore, it is possible to generate the binarized signal based on the first detection signal with reliability higher than that of the prior art.

REFERENCE SIGNS LIST

2: average value signal generator circuit, 3, 3A: offset signal generator circuit, 10, 10A, 10B, 10C: rotation detector apparatus, 20, 20A, 20B, 20C: binarization circuit, 21: differential amplifier, 22: peak hold circuit, 23: bottom hold circuit, 24: average value calculator circuit, 25, 25A: comparator circuit, 26: counter circuit, 27: D/A converter, 28: comparator, 29: hysteresis comparator, 30: rotation detector circuit, 31, 32, 33, 34: magneto-resistive effect elements, 35, 36: connection point, 37: bridge circuit, 38: differential amplifier, 39: magneto-resistive effect element unit, 40: magnet, 41, 42: comparison level generator circuit, 50: gear, 60: rail, 61: moving body, 62: rail, 90, 90A, 90B, 90C: timing generator circuit, 251, 252: comparator, 253, 254: flip-flop circuit, 255: comparator, 256: inverter, 257, 258: flip-flop circuit, 281: threshold value generator circuit.

The invention claimed is:

1. A rotation detector apparatus comprising:
a rotation detector circuit that generates a first detection signal that detects rotation of a rotating body and changes according to the rotation of the rotating body, and outputs the first detection signal; and
a binarization circuit for processing the first detection signal,
wherein the binarization circuit comprises:
an offset correction signal generator circuit that generates, based on an inputted offset signal and the first detection signal, an offset correction signal representing a difference between the first detection signal and an offset signal;
a first comparator circuit that compares the offset correction signal with a predetermined first threshold voltage, and outputs a binarized signal representing a comparison result;
an average value signal generator circuit that generates an average value signal representing an average value of the offset correction signal; and
an offset signal generator circuit that compares a signal voltage of the average value signal with a predetermined second threshold voltage and a third threshold voltage that is larger than the second threshold voltage, and generates the offset signal so that the signal voltage of the average value signal has a voltage value between the second threshold voltage and the third threshold voltage, wherein the second threshold voltage is set to a voltage smaller than the first threshold voltage, the third threshold voltage is set to a voltage larger than the first threshold voltage, the first comparator circuit compares the offset correction signal with one of the second threshold voltage and the third threshold voltage by selectively setting the first threshold voltage to either one of the second threshold voltage and the third threshold voltage according to the signal voltage of the binarized signal based on the first threshold voltage and the binarized signal, and outputs a binarized signal representing a comparison result, and the first comparator circuit outputs a selectively set second threshold voltage or third threshold voltage to the offset signal generator circuit.

2. A movement detector apparatus comprising:

a movement detector circuit that generates a first detection signal that detects movement of a moving body and changes according to the movement of the moving body, and outputs the first detection signal; and a binarization circuit for processing the first detection signal, wherein the binarization circuit comprises:

an offset correction signal generator circuit that generates, based on an inputted offset signal and the first detection signal, an offset correction signal representing a difference between the first detection signal and an offset signal;

a first comparator circuit that compares the offset correction signal with a predetermined first threshold voltage, and outputs a binarized signal representing a comparison result;

an average value signal generator circuit that generates an average value signal representing an average value of the offset correction signal; and an offset signal generator circuit that compares a signal voltage of the average value signal with a predetermined second threshold voltage and a third threshold voltage that is larger than the second threshold voltage, and generates the offset signal so that the signal voltage of the average value signal has a voltage value between the second threshold voltage and the third threshold voltage, wherein the second threshold voltage is set to a voltage smaller than the first threshold voltage, the third threshold voltage is set to a voltage larger than the first threshold voltage, the first comparator circuit compares the offset correction signal with one of the second threshold voltage and the third threshold voltage by selectively setting the first threshold voltage to either one of the second threshold voltage and the third threshold voltage according to the signal voltage of the binarized signal based on the first threshold voltage and the binarized signal, and outputs a binarized signal representing a comparison result, and the first comparator circuit outputs a selectively set second threshold voltage or third threshold voltage to the offset signal generator circuit.

3. A binarization circuit for processing a detection signal, comprising:

an offset correction signal generator circuit that generates, based on an inputted offset signal and a first detection signal, an offset correction signal representing a difference between the first detection signal and an offset signal, the first detection signal detecting one of rotation and movement of an object and changing according to the one of rotation and movement of the object;

a first comparator circuit that compares the offset correction signal with a predetermined first threshold voltage, and outputs a binarized signal representing a comparison result;

an average value signal generator circuit that generates an average value signal representing an average value of the offset correction signal; and an offset signal generator circuit that compares a signal voltage of the average value signal with a predetermined second threshold voltage and a third threshold voltage that is larger than the second threshold voltage, and generates the offset signal so that the signal voltage of the average value signal has a voltage value between the second threshold voltage and the third threshold voltage, wherein the second threshold voltage is set to a voltage smaller than the first threshold voltage, the third threshold voltage is set to a voltage larger than the first threshold voltage, the first comparator circuit compares the offset correction signal with one of the second threshold voltage and the third threshold voltage by selectively setting the first threshold voltage to either one of the second threshold voltage and the third threshold voltage according to the signal voltage of the binarized signal based on the first threshold voltage and the binarized signal, and outputs a binarized signal representing a comparison result, and the first comparator circuit outputs a selectively set second threshold voltage or third threshold voltage to the offset signal generator circuit.

4. A binarization circuit for processing a detection signal, comprising:

an offset correction signal generator circuit that generates, based on an inputted offset signal and a first detection signal, an offset correction signal representing a difference between the first detection signal and an offset signal, the first detection signal detecting one of rotation and movement of an object and changing according to the one of rotation and movement of the object;

a first comparator circuit that compares the offset correction signal with a predetermined first threshold voltage, and outputs a binarized signal representing a comparison result;

an average value signal generator circuit that generates an average value signal representing an average value of the offset correction signal; and an offset signal generator circuit that compares a signal voltage of the average value signal with a predetermined second threshold voltage and a third threshold voltage that is larger than the second threshold voltage, and generates the offset signal so that the signal voltage of the average value signal has a voltage value between the second threshold voltage and the third threshold voltage, wherein the offset signal generator circuit comprises:

a second comparator circuit that compares the signal voltage of the average value signal with the second threshold voltage and the third threshold voltage, and generates an up-count instruction signal representing that the signal voltage of the average value signal is smaller than the second threshold voltage and a down-count instruction signal representing that the signal voltage of the average value signal is larger than the third threshold voltage;

a counter circuit that increments a counted value by a predetermined amount of change in response to the up-count instruction signal, decrements the counted value by the amount of change in response to the down-count instruction signal, and outputs the counted value; and a digital-to-analog converter that converts the counted value to the offset signal, and outputs the offset signal to the offset correction signal generator circuit, wherein the binarization circuit further comprises a controller that controls the average value signal generator circuit and the offset signal generator circuit so as to generate the offset signal at a predetermined first timing, and wherein, during activation of the binarization circuit for processing a detection signal, (A) the controller controls the average value signal generator circuit and the offset signal generator circuit so as to generate the offset signal at a second timing interval shorter than a first timing interval used when the signal voltage of the average value signal is larger than the second threshold voltage and smaller than the third threshold voltage, and (B) the controller controls the amount of change of the counted value to be larger than the amount of change of the counted value when the signal voltage of the average value signal is larger than the second threshold value and is smaller than the third threshold value.

5. The binarization circuit for processing the detection signal as claimed in claim 4, wherein the object is a rotating body, and wherein, the controller receives a second detection signal representing whether or not the rotating body is rotating, and operates the offset signal generator circuit when the controller detects that the rotating body is rotating and the voltage level of the binarized signal has not changed for a predetermined time period based on the second detection signal and the binarized signal.

6. The binarization circuit for processing the detection signal as claimed in claim 4, wherein the object is a moving body, and wherein, the controller receives a third detection signal representing whether or not the moving body is moving, and operates the offset signal generator circuit when the controller detects that the moving body is moving and the voltage level of the binarized signal has not changed for a predetermined time period based on the third detection signal and the binarized signal.

* * * * *